(12) United States Patent
Du et al.

(10) Patent No.: US 11,159,023 B2
(45) Date of Patent: Oct. 26, 2021

(54) MEASUREMENT DATA BASED METHOD FOR IDENTIFYING WIND TURBINE GENERATORS WHICH CAUSE SUB-SYNCHRONOUS OSCILLATIONS IN COMPLEX POWER SYSTEM

(71) Applicant: Wenjuan Du, Beijing (CN)

(72) Inventors: Wenjuan Du, Beijing (CN); Qiang Fu, Beijing (CN); Haifeng Wang, Beijing (CN)

(73) Assignee: Wenjuan Du, Beijing (CN)

( * ) Notice: Subject to any disclaimer, the term of this patent is extended or adjusted under 35 U.S.C. 154(b) by 421 days.

(21) Appl. No.: 16/201,956

(22) Filed: Feb. 26, 2019

(65) Prior Publication Data
US 2019/0214826 A1   Jul. 11, 2019

(30) Foreign Application Priority Data

Nov. 7, 2018   (CN) .......................... 201811320582.6

(51) Int. Cl.
| | |
|---|---|
| *H02J 3/38* | (2006.01) |
| *H02J 3/01* | (2006.01) |
| *F03D 17/00* | (2016.01) |
| *H02M 1/12* | (2006.01) |
| *G01R 23/08* | (2006.01) |
| *G01R 23/167* | (2006.01) |

(52) U.S. Cl.
CPC .............. *H02J 3/386* (2013.01); *F03D 17/00* (2016.05); *G01R 23/08* (2013.01); *G01R 23/167* (2013.01); *H02J 3/01* (2013.01); *H02M 1/126* (2013.01); *F05B 2200/00* (2013.01); *F05B 2260/80* (2013.01)

(58) Field of Classification Search
CPC ... H02J 3/01; H02J 3/386; H02J 3/241; F03D 17/00; G01B 23/08; G01B 23/167; H02M 1/126; F05B 2200/00; F05B 2200/80
See application file for complete search history.

(56) References Cited

U.S. PATENT DOCUMENTS

| | | | |
|---|---|---|---|
| 9,806,690 B1* | 10/2017 | Gong ........................ | H02H 3/48 |
| 2012/0299305 A1* | 11/2012 | Brogan ................... | H02J 3/381 |
| | | | 290/55 |
| 2016/0141991 A1* | 5/2016 | Khalili Nia ............... | H02J 3/24 |
| | | | 322/19 |
| 2018/0159453 A1* | 6/2018 | Andersen ................ | H02P 9/007 |

* cited by examiner

*Primary Examiner* — Regis J Betsch
*Assistant Examiner* — Jeremy A Delozier

(57) ABSTRACT

A measurement data based method for identifying wind turbine generators which cause sub-synchronous oscillations in a complex power system has a theoretical foundation of the open-loop modal resonance and the parallel filter design. The advantages of the present invention are as follows. 1) The present invention can identify the wind turbine generators which cause the SSOs in the complex power system using measurement data instead of parametric model. Hence, it simplifies the computation and reduces the modeling cost effectively. 2) The present invention can identify the wind turbine generators which cause the SSOs in the complex power system precisely with reduced amount of measurement data, reducing the cost of hardware and data measurement effectively. 3) The present invention can identify the wind turbine generators which cause the SSOs in the complex power system based on the open-loop modal resonance theory.

12 Claims, 32 Drawing Sheets

图16(a)

MEASUREMENT DATA BASED METHOD FOR IDENTIFYING WIND TURBINE GENERATORS WHICH CAUSE SUB-SYNCHRONOUS OSCILLATIONS IN COMPLEX POWER SYSTEM

CROSS REFERENCE OF RELATED APPLICATION

The present invention claims priority under 35 U.S.C. 119(a-d) to CN 201811320582.6, filed Nov. 7, 2018.

BACKGROUND OF THE PRESENT INVENTION

Field of Invention

The present invention belongs to the technical scope of wind power integration. In specific, a measurement data based method for identifying the wind turbine generators which cause the sub-synchronous oscillations in a complex power system is involved.

Description of Related Arts

In recent years, with the development of renewable power generation, the voltage source converters (VSCs) have been widely applied in integrations of wind power and photovoltaic power generation in together with the VSC-based DC transmissions. As the VSCs are of the advantages of flexible controllability, weak AC power system interconnection ability and free of commutation failure, they have become important devices for constructing a smart grid in future. However, the SSOs in power systems as caused by grid-connected wind turbine generators have been a serious threat to the stability of power systems.

In order to develop measures to suppress the SSOs caused by the grid connection of wind turbine generators, first of all, the wind turbine generators which cause the SSOs need to be identified in a complex power system. So far, two main methods of identification have been proposed and applied. They are the simulation model based identification method and frequency scan based identification method. The former identification method is based on simulation platforms and parametric model of power system. After the parametric model of the complex power system is derived, time-domain simulation or/and modal analysis can be conducted to identify the wind turbine generators which cause the SSOs in the complex power system.

Time-domain simulation is based on a conventional simulation platform. By using the modules provided in the simulation platform, operation of the power systems is approximated. During the simulation, the SSOs are reproduced and then the wind turbine generators which cause the SSOs are identified by running simulation and comparing the results of simulation. Nevertheless, main drawbacks of time-domain simulation method are as follows. First, the conventional simulation platforms are of two categories: time-domain software simulation platforms (such as Simulink or PSCAD) and real-time hardware simulation platforms (such as RTDS or RTLAB). No matter which kind of simulation platform is adopted to reproduce the SSOs in the power system, even small error during the simulation process can cause significant difference between the simulation results and field measurement. Reproduction of the SSOs is a challenging and time-consuming job. If the SSOs in a practical power system cannot be reproduced by simulation platforms completely, the simulation results obtained may be meaningless. Second, collecting accurate operational parameters of the practical power system is often very difficult, demanding significant amount of manpower and resources, especially when the scale of the power system is large. Furthermore, considering the complexity of time-variable operational conditions of the practical power system, the time-domain simulation method may very possibly not be able to replicate real operational status of the practical power system to reproduce the SSOs. Those disadvantages have limited the application of time-domain simulation method for identifying the wind turbine generators which cause the SSOs.

Modal analysis is based on the linearized model of the power system at a given operation point of power system, i.e., the state-space model. Power system stability is evaluated by calculating the oscillation modes. Drawbacks of modal analysis method are as follows: (1) Establishment of the linearized state-space model needs complete and accurate data of the power system, including the wind turbine generators, which may not be possible in practice; (2) Dimension of the established linearized state-space model may be too high to be handled with numerically.

Frequency scan based identification method is based on the measurement data. Hence, establishment of parametric model of the power system is not required. This is the main advantage of frequency scan method. Theoretical foundation of frequency scan based identification method is the Nyquist stability criterion. By measuring the impedance of power system and wind turbine generators, system SSO stability can be assessed as to be elaborated briefly as follows.

Normally, resistance of a power system is positive. Resistance of grid-connected wind turbine generators under various frequencies can be measured. If the measured resistance of a wind turbine generator is negative at a frequency, the wind turbine generator may possibly degrade the system stability at the frequency. Frequency scan based identification method is to find the frequency at which the resistance of wind turbine generator is negative such that the instability risk brought about by the wind turbine generator is detected. Drawbacks of the frequency scan based identification method are as follows: (1) The measurement needs to be carried out sequentially by disconnecting each of wind turbine generators with the power system. Thus, system operating points vary when the measurement is conducted for each of wind turbine generators in the power system. None of those operating points can be the real operating point at which all the wind turbine generators are connected with the power system; (2) Positive resistance is the sufficient condition of system stability. Hence, even though the resistance of a wind turbine generator is found being negative, theoretically it cannot conclude that the system is unstable.

SUMMARY OF THE PRESENT INVENTION

In order to solve the drawbacks of conventional methods, a novel measurement data based method for identifying the wind turbine generators which cause the SSOs in a complex power system is proposed. The advantages of the present invention are as follows.

1) The present invention can identify the wind turbine generators which cause the SSOs in the complex power system using measurement data instead of parametric model. Hence, it simplifies the computation and reduces the modeling cost effectively.

2) The present invention can identify the wind turbine generators which cause the SSOs in the complex power system precisely with reduced amount of measurement data, reducing the cost of hardware and data measurement effectively.

3) The present invention can identify the wind turbine generators which cause the SSOs in the complex power system based on the open-loop modal resonance theory, which provides a necessary and sufficient condition for the evaluation of system stability.

The specific technical schemes are demonstrated as follows:

(1) obtaining a set of measurement data when the SSOs occur in the power system; reducing noise by applying a filtering algorithm; identifying an SSO frequency by using a signal processing method; wherein the identified SSO frequency is denoted as $f_s$.

It should be noted that the signal processing method could be any method which can determine the oscillation frequency (such as the Prony analysis or FFT method).

(2) designing a parallel band-pass filter to ensure that only a signal at frequency $f_s$ passes through to earth and signals at other frequencies are suppressed.

It should be noted that the designed filter is acceptable if its magnitude-frequency characteristic is similar to the one shown in FIG. 6, where $(1-n\%)f_s$ and $(1+n\%)f_s$ are cutoff frequencies of the designed filter, value of n % is usually less than 30%.

(3) for a power system with n wind turbine generators, installing the parallel band-pass filter designed in the step (2) on an interface between each of the wind turbine generators and the power system; wherein subsequently, dynamic interactions between the wind turbine generators and the power system at the SSO frequency $f_s$ are suppressed and filtered out; whilst those at other frequencies are not affected.

It should be noted that although the point of common connection (PCC) is generally selected as the interface, actually any point which can divide a wind turbine generator from the power system can be chosen as the interface. The points that can be chosen as the interface are shown in FIG. 7.

(4) measuring a response from each of the wind turbine generators by adding a disturbance signal on a side of a wind turbine generator near the band-pass filter.

It should be noted that the injection point of disturbance signal and measurement point should be located on the side of wind turbine generator near the band-pass filter which are shown in FIG. 8.

Moreover, disturbance signal should excite observable dynamic response of the wind turbine generator. FIG. 9 gives an impulse signal as an example of disturbance signal. The time duration and magnitude of the signal are respectively 0.1 second and 2% of the magnitude of terminal voltage at the node where the wind turbine generator is connected with the power system.

Furthermore, wind turbine generator's response is chosen to be the active power output from the wind turbine generator.

(5) from the measurement data of the response of an i-th wind turbine generator, identifying an oscillation frequency, $f_{ij}$, and a residue $R_{ij}$ by applying a signal processing method; wherein in notations above for $f_{ij}$ and $R_{ij}$, subscript i refers to the i-th wind turbine generator and the subscript j refers to the j-th SSO frequency identified;

afterwards, comparing $f_{ij}$ and $f_s$; recording the $f_{ij}$ and $R_{ij}$ if a following condition is met:

$$1.05*f_s \geq f_{ij} \geq 0.95*f_s;$$

wherein finally, if no $f_{ij}$ which can meet the above condition, it is concluded that the i-th wind turbine generator is not the wind turbine generator which causes the SSOs in the power system.

It should be noted that the signal processing method could be any method which can determine the oscillation frequency (such as the Prony analysis or FFT method).

(6) measuring the response from the power system by adding a disturbance signal on the side of the power system near the band-pass filter for the i-th wind turbine generator.

It should be noted that the injection point of disturbance signal and measurement point should be located on the side of power system near the band-pass filter which are shown in FIG. 10.

Moreover, the disturbance signal should excite the observable dynamic response of the power system. FIG. 9 gives an impulse signal as an example of disturbance signal. The time duration and magnitude of the signal are respectively 0.1 second and 2% of the magnitude of terminal voltage at the node where the i-th wind turbine generator is connected with the power system.

Furthermore, power system response is chosen to be a magnitude of a terminal voltage at a node in the power system where the i-th wind turbine generator is connected to the power system.

(7) from the measurement data of the response, identifying an oscillation frequency $f_{aij}$ and a residue $R_{aij}$ by using the signal processing method: wherein in notations of $f_{aij}$ and $R_{aij}$, subscript a indicates that the measurement data is about the power system, subscript i refers to the i-th wind turbine generator and subscript j refers to the j-th oscillation frequency and residue;

afterwards, comparing $f_{aij}$ and $f_s$; recording $f_{aij}$ and $R_{aij}$ if a following condition is met:

$$1.05*f_s \geq f_{aij} \geq 0.95*f_s;$$

It should be noted that the signal processing method could be any method which can determine the oscillation frequency (such as the Prony analysis or FFT method).

(8) Computing $Z_i=|R_{ij}R_{aij}|$, i=1.2, L n based on recorded results in the step (5) and (7); wherein if $Z_k$ is the largest among $Z_i$, i=1.2, L n, the i-th wind turbine generator is identified to be the wind turbine generator causing the SSOs in the power system.

Theoretical foundation of the present invention is the open-loop modal resonance and the parallel filter design. They are introduced respectively as follows.

1. Open-Loop Modal Resonance Theory

FIG. 1 shows an AC power system integrated with multiple wind turbine generators, where $P_{WTGi}+Q_{WTGi}$ is the power output of the i-th wind turbine generator (WTG-i); $V_{cdi}+jV_{cqi}$ is the terminal voltage of and $I_{di}+jI_{qi}$ is the current output from WTG-i; $V_{pcci}$ and $\theta_{pcci}$ are the magnitude and phase angle of the voltage at the PCC; $X_{fi}$ is the reactance of the filter. By choosing the PCC of the i-th WTG as the point of interference, the power system can be divided into two subsystems. They are the WTG-i subsystem and subsystem of remainder of power system (ROPS) [1-2].

Normally, the WTG operates with high even unity power factor such that dynamic variation of reactive power output from the i-th WTG is very small or zero [3-6].

Consequently, the input dynamic variable to the WTG-i subsystem is the variation of magnitude of terminal voltage at the PCC. The output dynamic variable from the WTG-i subsystem is the variation of active power output from WTG-i. The input dynamic variable to the ROPS subsystem is the variation of active power output from WTG-i. The output dynamic variable is the variation of magnitude of terminal voltage at the PCC [1-2]. Therefore, linearized models of the WTG-i subsystem and the ROPS subsystem can be described by Eq. (1) and (2) respectively.

$$\frac{d}{dt}\Delta X_{WTGi} = A_{WTGi}\Delta X_{WTGi} + b_{WTGi}\Delta V_{pcci} \quad (1)$$
$$\Delta P_{WTGi} = c_{WTGi}^T \Delta X_{WTGi}$$

$$\frac{d}{dt}\Delta X_{aci} = A_{aci}\Delta X_{aci} + b_{aci}\Delta P_{WTGi} \quad (2)$$
$$\Delta V_{pcci} = c_{aci}^T \Delta X_{aci}$$

Eq. (1) is the state-space model of WTG-i subsystem. Open-loop oscillation modes of WTG-i subsystem are $\lambda_{vn}$, n=1, 2 ... N which are the eigenvalues of state-space matrix $A_{WTGi}$. Eq. (2) is the state-space model of the ROPS subsystem. Open-loop oscillation modes of ROPS subsystem are $\lambda_{acm}$, m=1, 2 ... M which are the eigenvalues of the state-space matrix $A_{aci}$. From Eq. (1) and (2), following transfer function models of the WTG-i subsystem and the ROPS subsystem are obtained $$\Delta P_{WTGi} = c_{WTGi}^T(sI - A_{WTGi})^{-1}b_{WTGi}\Delta V_{pcci} = K_{WTGi}(s) \Delta V_{pcci} \quad (3)$$

$$\Delta V_{pcci} = c_{aci}^T(sI - A_{aci})^{-1}b_{aci}\Delta P_{WTGi} = K_{aci}(s)\Delta P_{WTGi} \quad (4)$$

For the power system integrated with multiple wind turbine generators, dynamic interactions between the wind turbine generators and the power system are usually weak. Since $\Delta P_{WTGi}$ in (3) is the exhibition of the dynamic interactions, normally it should have $\Delta P_{WTGi} \approx 0$. Hence, there should exist a small gain value $\varepsilon(\varepsilon \ll 1)$ such that the transfer function of WTG-i subsystem can be expressed as $K_{WTGi}(s) = \varepsilon_i G_{WTGi}(s)$. Therefore, Eq. (3) can be written as $$\Delta P_{WTGi} = K_{WTGi}(s)\Delta V_{pcci} = \varepsilon_i G_{WTGi}(s)\Delta V_{pcci} \quad (5)$$

By combining Eq. (4) and Eq. (5), the power system shown in FIG. 1 can be represented by a closed-loop interconnected model which is displayed in FIG. 2.

Oscillation modes of closed-loop interconnected model thus are referred as closed-loop oscillation modes. Accordingly, oscillation modes of WTG-i subsystem and ROPS subsystem are called open-loop oscillation modes as introduced above Eq. (1) and (2). They are $\lambda_{vn}$, n=1, 2 ... N and $\lambda_{acm}$, m=1, 2 ... M. Obviously, the closed-loop oscillation modes are the solutions of $K_{aci}(s)\varepsilon_i G_{WTGi}(s)=1$. In addition, $\Delta P_{WTGi}$, is the exhibition of the dynamic interactions between the WTG-i subsystem and the ROPS subsystem.

As being mentioned before, dynamic interactions between WTG-i and the power system are usually weak such that $\Delta P_{WTGi} \approx 0$. Consequently, the closed-loop interconnected model is approximately open such that the closed-loop oscillation modes are approximately equal to the open-loop oscillation modes. This implies that normally integration of the WTG may not affect the stability of closed-loop interconnected system considerably. However, when an open-loop oscillation mode of WTG-i subsystem and an open-loop oscillation mode of ROPS subsystem in FIG. 2 are close to each other on the complex plane, stability of closed-loop system shown by FIG. 2 may be affected considerably. This particular modal condition is examined as follows. The characteristic equation of closed-loop interconnected system shown by FIG. 2 is $$\varepsilon K_{ac}(s)G_{WTG}(s)=1 \quad (6)$$

Without loss of generality, donate $\lambda_{vi}$ and $\lambda_{aci}$ as open-loop oscillation modes of the WTG-i subsystem and the ROPS subsystem respectively. Transfer functions of two subsystems can be expressed as $$K_{ac}(s) = \frac{k_{ac}(s)}{s - \lambda_{aci}}, \quad G_{WTG}(s) = \frac{g_{WTG}(s)}{s - \lambda_{vi}} \quad (7)$$

By substituting Eq. (7) into Eq. (6), it can have $$\varepsilon k_{ac}(s)g_{WTG}(s)=(s-\lambda_{aci})(s-\lambda_{vi}) \quad (8)$$

Eq. (8) can be simply expressed as $$\varepsilon f(s)=\lambda(s) \quad (9)$$

where $f(s)=k_{ac}(s)g_{WTG}(s)$, $\lambda(s)=(s-\lambda_{aci})(s-\lambda_{vi})$.

Obviously, the closed-loop oscillation modes $\hat{\lambda}_{vi}=\lambda_{vi}+\Delta\lambda_{vi}$ and $\hat{\lambda}_{aci}=\lambda_{aci}+\Delta\lambda_{aci}$ are the solutions of Eq. (9). By substituting $\hat{\lambda}_{vi}$ into Eq. (9), it can have $$\varepsilon f(\lambda_{vi}+\Delta\lambda_{vi})=\lambda(\lambda_{aci}+\Delta\lambda_{aci}) \quad (10)$$

Expand Eq. (10) at $\lambda_{vi}$ on the basis of Taylor's theorem, it can have $$\varepsilon\left[f(\lambda_{vi}) + f'(\lambda_{vi})\Delta\lambda_{vi} + \frac{f''(\lambda_{vi})}{2!}\Delta\lambda_{vi}^2 + \ldots\right] = \quad (11)$$
$$\lambda(\lambda_{vi}) + \lambda'(\lambda_{vi})\Delta\lambda_{vi} + \frac{\lambda''(\lambda_{vi})}{2!}\Delta\lambda_{vi}^2 + \ldots$$

Substitute $\Delta\lambda_{vi}=\alpha_1\varepsilon+\alpha_2\varepsilon^2+\alpha_3\varepsilon^3+\ldots$ [7] into Eq. (11), it can have $$\varepsilon\left[f(\lambda_{vi}) + f'(\lambda_{vi})(\alpha_1\varepsilon + \alpha_2\varepsilon^2 + \alpha_3\varepsilon^3 + \ldots) + \right. \quad (12)$$
$$\left.\frac{f''(\lambda_{vi})}{2!}(\alpha_1\varepsilon + \alpha_2\varepsilon^2 + \alpha_3\varepsilon^3 + \ldots)^2 + \ldots\right] =$$
$$\lambda(\lambda_{vi}) + \lambda'(\lambda_{vi})(\alpha_1\varepsilon + \alpha_2\varepsilon^2 + \alpha_3\varepsilon^3 + \ldots) +$$
$$\frac{\lambda''(\lambda_{vi})}{2!}(\alpha_1\varepsilon + \alpha_2\varepsilon^2 + \alpha_3\varepsilon^3 + \ldots)^2 + \ldots$$

As $\varepsilon$ is infinitesimal small number, the high-order terms in Eq. (12) can be ignored. Eq. (12) can be rewritten as $$\alpha_1 = \frac{f(\lambda_{vi})}{\lambda'(\lambda_{vi})} = \frac{f(\lambda_{vi})}{\lambda_{vi} - \lambda_{aci}} \quad (13)$$

Substitute Eq. (13) into $\Delta\lambda_{vi}=\alpha_1\varepsilon+\alpha_2\varepsilon^2+\alpha_3\varepsilon^3+\ldots$, the approximate solution for the variation of the closed-loop oscillation mode $\Delta\lambda_{vi}$ is obtained to be $$\Delta\lambda_{vi} = \hat{\lambda}_{vi} - \lambda_{vi} \approx \alpha_1\varepsilon = \varepsilon\frac{k_2(\lambda_{vi})g(\lambda_{vi})}{\lambda_{vi} - \lambda_{aci}} \quad (14)$$

Similarly, the approximate solution for the variation of closed-loop oscillation mode $\Delta\lambda_{aci}$ is obtained to be $$\Delta\lambda_{aci} = \hat{\lambda}_{aci} - \lambda_{aci} \approx \alpha_1\varepsilon = \varepsilon\frac{k_2(\lambda_{aci})g(\lambda_{aci})}{\lambda_{aci} - \lambda_{vi}} \quad (15)$$

From Eq. (14) and Eq. (15), it can be seen that when the open-loop oscillation modes $\lambda_{vi}$ and $\lambda_{aci}$ are far away from each other on the complex plane, the dynamic interactions between two subsystems are weak because the difference between the closed-loop and open-loop oscillation modes is small as it is proportional to the small number $\varepsilon$.

However, when the open-loop oscillation modes of those subsystems are close to each other on the complex plane, the dynamic interactions between two subsystems may become significant because $\Delta\lambda_{vi}$ and $\Delta\lambda_{aci}$ may not be small any more as being indicated by (15). In addition, the difference between closed-loop and open-loop oscillation modes for two open-loop oscillation modes are of opposite signs, i.e. $\Delta\lambda_{vi} = -\Delta\lambda_{aci}$, which implies that two closed-loop oscillation modes are located at the opposite positions on the complex plane in respect to their corresponding open-loop oscillation modes. This can be further elaborated for an extreme open-loop modal condition, $\lambda_{vi} = \lambda_{aci}$, as follows.

Under the condition of $\lambda_{vi} = \lambda_{aci}$, by substituting $\Delta\lambda_{vi} = \beta_1\varepsilon^{1/2} + \beta_2\varepsilon^{2/2} + \beta_3\varepsilon^{3/2} + \ldots$ into Eq. (11), it can have $$\varepsilon\left[f(\lambda_{vi}) + f'(\lambda_{vi})\left(\beta_1\varepsilon^{\frac{1}{2}} + \beta_2\varepsilon^{\frac{2}{2}} + \beta_3\varepsilon^{\frac{3}{2}} + \ldots\right) + \frac{f''(\lambda_{vi})}{2!}\left(\beta_1\varepsilon^{\frac{1}{2}} + \beta_2\varepsilon^{\frac{2}{2}} + \beta_3\varepsilon^{\frac{3}{2}} + \ldots\right)^2 + \ldots\right] = \lambda(\lambda_{vi}) + \lambda'(\lambda_{vi})\left(\beta_1\varepsilon^{\frac{1}{2}} + \beta_2\varepsilon^{\frac{2}{2}} + \beta_3\varepsilon^{\frac{3}{2}} + \ldots\right) + \frac{\lambda''(\lambda_{vi})}{2!}\left(\beta_1\varepsilon^{\frac{1}{2}} + \beta_2\varepsilon^{\frac{2}{2}} + \beta_3\varepsilon^{\frac{3}{2}} + \ldots\right)^2 + \ldots \quad (16)$$

Under the condition of $\lambda_{vi} = \lambda_{aci}$, it can be obtained that $\lambda(\lambda_{vi})' = 0$ and $\lambda(\lambda_{vi})'' = 2$. Therefore, by cancelling out high-order terms, Eq. (16) can be simplified as $$f(\lambda_{vi}) = \frac{\lambda''(\lambda_{vi})}{2!}\beta_1^2 \quad (17)$$

By expanding open-loop transfer functions of subsystems, $G_{WTG}(s)$ and $K_{ac}(s)$ can be expressed as $$G_{WTG}(s) = \frac{R_{vi}}{(s-\lambda_{vi})} + \sum_{j=2}^{n}\frac{R_{vj}}{(s-\lambda_{vj})} \quad (18)$$

$$K_{ac}(s) = \frac{R_{aci}}{(s-\lambda_{aci})} + \sum_{j=2}^{m}\frac{R_{acj}}{(s-\lambda_{acj})}$$

where $R_{vi}$, $i=1, 2, \ldots, n$ are the residues corresponding to $\lambda_{vi}$, $i=1, 2 \ldots n$; $R_{aci}$, $i=1, 2, \ldots m$ are the residues corresponding to $\lambda_{aci}$, $i=1, 2 \ldots m$. Therefore, it can have $$f(\lambda_{vi}) = (s-\lambda_{vi})(s-\lambda_{aci})G_{WTG}(s)K_{ac}(s)|_{s=\lambda_{vi}=\lambda_{aci}} = R_{vi}R_{aci} \quad (19)$$

By combining Eq. (17) and Eq. (19), it can have $$\beta_1 = \pm\sqrt{R_{vi}R_{aci}} \quad (20)$$

From Eq. (20), it can have $$\hat{\lambda}_{vi} \approx \lambda_{vi} + \sqrt{\varepsilon R_{vi}R_{aci}}$$

$$\hat{\lambda}_{aci} \approx \lambda_{aci} - \sqrt{\varepsilon R_{vi}R_{aci}} \quad (21)$$

It can be concluded from Eq. (21) that, if the open-loop subsystems are stable, the closed-loop system is prone to be destabilized with larger modal residues when the open-loop modal resonance happens, i.e., $\lambda_{vi} \approx \lambda_{aci}$. Particularly, the system may be unstable under the condition that $|\text{Real}(\sqrt{\varepsilon R_{vi}R_{aci}})| > |\text{Real}(\lambda_{vi})|$.

2. Parallel Filtering Method

According to the theory of open-loop modal resonance, a wind turbine generator which causes the SSOs can be detected by identifying the open-loop SSO modes and comparing the associated residues of wind turbine generator and power system. When the identification is conducted by using the measurement data, the measurement data of open-loop subsystems, i.e., the wind turbine generator and power system, need to be obtained. The SSOs are caused by the grid connection of wind turbine generator. This means that the SSOs occur in the power system when the wind turbine generator is connected. For the detection of wind turbine generator to cause the SSOs, open-loop SSO modes and residues of wind turbine generator and power system need to be identified when the wind turbine generator is connected. If the measurement is conducted by disconnecting the wind turbine generator, though the measurement data obtained are about the open-loop wind turbine generator and power system such that the open-loop SSO modes and associated residues are obtained, it is not ensured that the open-loop SSO modes and associated residues are equal to the required open-loop SSO modes and residues when the wind turbine generator is connected to the power system. This problem is solved by parallel filtering method to be introduced as follows.

Parallel filtering method is to identify the open-loop SSO frequency and associated residues of the wind turbine generators and the power system when the wind turbine generator is connected to the power system. That is to identify the open-loop SSO modes and associated residues of open-loop subsystems on the basis of measurement data obtained from the closed-loop interconnected system FIG. 2 shows the closed-loop interconnected model with the wind turbine generator subsystem (represented by $G_{WTGi}(s)$) and the subsystem of remainder of power system (ROPS, represented by $K_{aci}(s)$). When the subsystems are expressed in the form of modal decomposition, configuration of closed-loop interconnected model is shown by FIG. 3. For the convenience of introduction, $\lambda_{aci}$, $R_{aci}$ and $\lambda_{vi}$, $R_{vi}$ are denoted as the SSO modes and associated residues of ROPS subsystem and wind turbine generator subsystem to be identified respectively. Frequency of SSOs is known to be $f_s$. The wind turbine generator which causes the SSOs needs to be detected by using the measurement data. Procedure to apply the parallel filtering method to obtain the data is as follows.

(1) Design a parallel band-pass filter to ensure that only the signal at frequency $f_s$ can pass through to earth, the signals at other frequencies are suppressed. The ideal magnitude-frequency characteristic of the filter is shown in FIG. 4.

(2) With the parallel band-pass filter being installed, configuration of the equivalent closed-loop interconnected model of the power system with the wind turbine generator is shown by FIG. 5. Subsequently, dynamic interactions between the wind turbine generators and the power system at the SSO frequency $f_s$ are suppressed and filtered out, whilst at other frequencies are not affected.

(3) From FIG. 5, it can be seen that the parallel filter suppresses the component in $\Delta P_{WTGi}$ and $\Delta V_{pcci}$ at the SSO frequency, $f_s$. This implies that the dynamic interactions between the wind turbine generator and power system at the SSO frequency, $f_s$, are suppressed. Since the frequencies of SSO modes, $\lambda_{aci}$ and $\lambda_{vi}$, are near $f_s$. Hence, with the band-pass filter being installed, the closed-loop interconnected system becomes effectively open. Consequently, the modal information of two open-loop subsystems, i.e., $R_{aci}$, $\lambda_{aci}$, $R_{vi}$ and $\lambda_{vi}$, can be measured successfully without having to physically disconnect the wind turbine generator from the power system.

The measurement data based method for identifying the wind turbine generators which cause the SSOs in the complex power system proposed in the present invention is of the following advantages.

1) The present invention can identify the wind turbine generators which cause the SSOs in the complex power system by using the measurement data without having to establish the parametric model.

2) The present invention can identify the wind turbine generators which cause the SSOs in the complex power system by using small amount of measurement data, reducing the cost of hardware and data measurement.

3) The present invention identifies the wind turbine generators which cause the SSOs in the complex power system based on the necessary and sufficient condition of system SSO stability, which is derived from the open-loop modal resonance theory

BRIEF DESCRIPTION OF THE DRAWINGS

FIG. 16(a) illustrates configuration of single-machine infinite power system integrated with a wind turbine generator;

DETAILED DESCRIPTION OF THE PREFERRED EMBODIMENT

Figure 11:
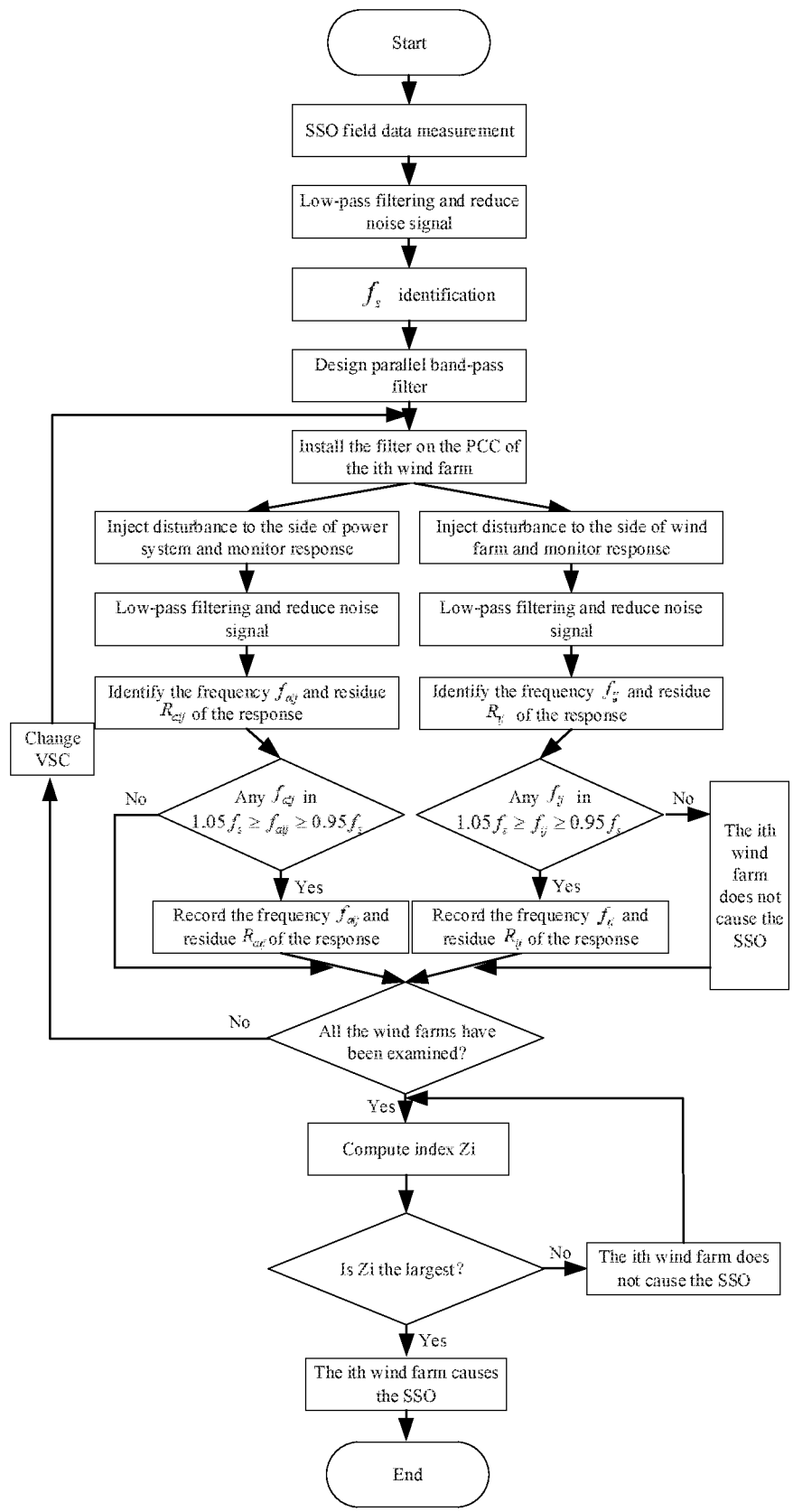
FIG. 11 illustrates technical schemes of the present invention.

The flowchart of the present invention shown in FIG. 11 is demonstrated by following two examples.

EXAMPLE 1

Figure 12:
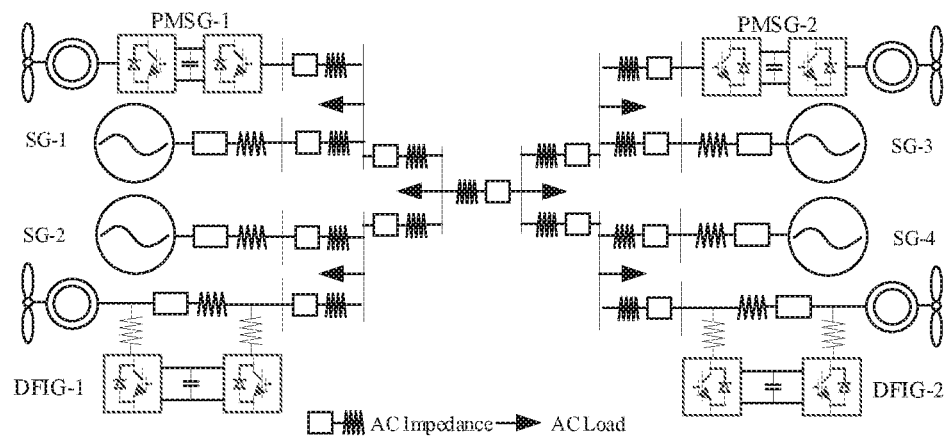
FIG. 12 illustrates configuration of 4-machine 2-area power system integrated with four wind turbine generators.

FIG. 12 shows a 4-machine 2-area power system integrated with two PMSGs and two DFIGs, which represent four grid-connected wind farms. When the SSOs occur, the wind turbine generators which cause the SSOs in the power system are identified by the present invention without using the parametric model of the power system. Detailed steps of identification are as follows.

1. Determine the SSO Frequency

In order to identify a wind turbine generator which causes the SSOs, the SSO frequency in the power system needs to be determined firstly. Afterwards, the band-pass filter can be designed near this frequency.

Step 1: reducing the noise in the measurement data.

Figure 13A:
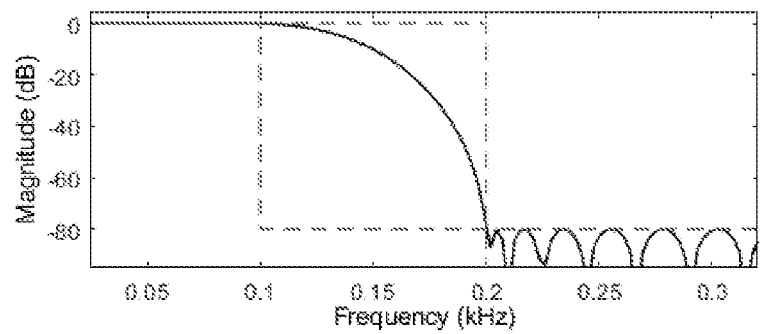
FIG. 13(a) illustrates magnitude-frequency characteristic of the low-pass filter.

A low-pass filter depicted in FIG. 13(a) is designed to reduce the harmonic components in the measurement data.

Step 2: determining the SSO frequency by the signal processing method.

Figure 13B:
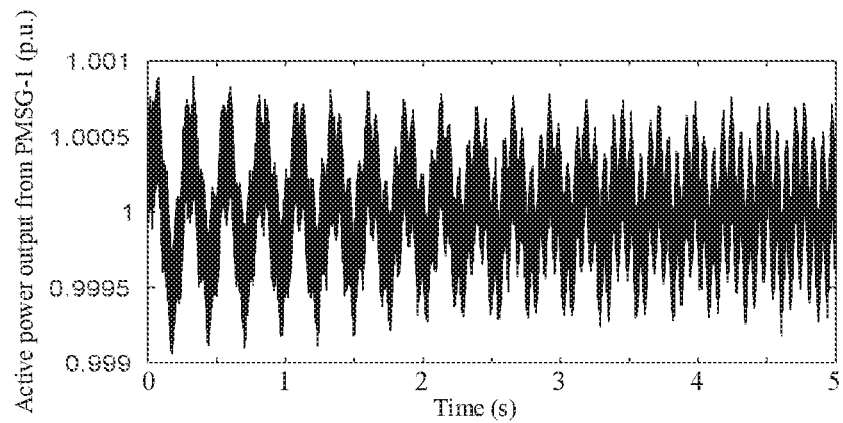
FIG. 13(b) illustrates active power output from PMSG-1 before filtering.
Figure 13C:
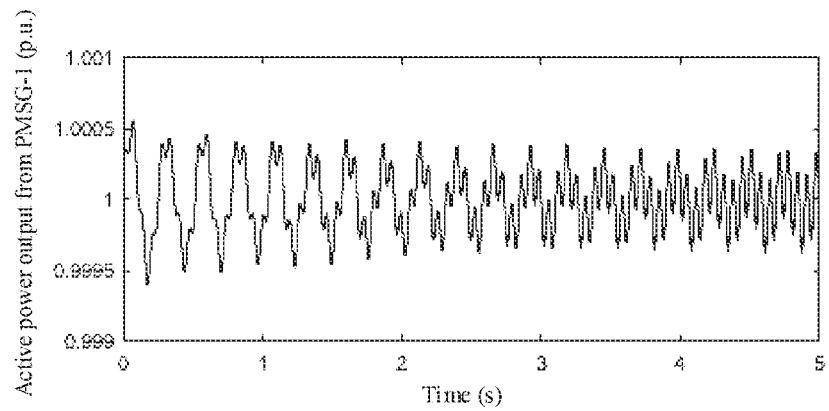
FIG. 13(c) illustrates active power output from PMSG-1 after filtering.
Figure 14:
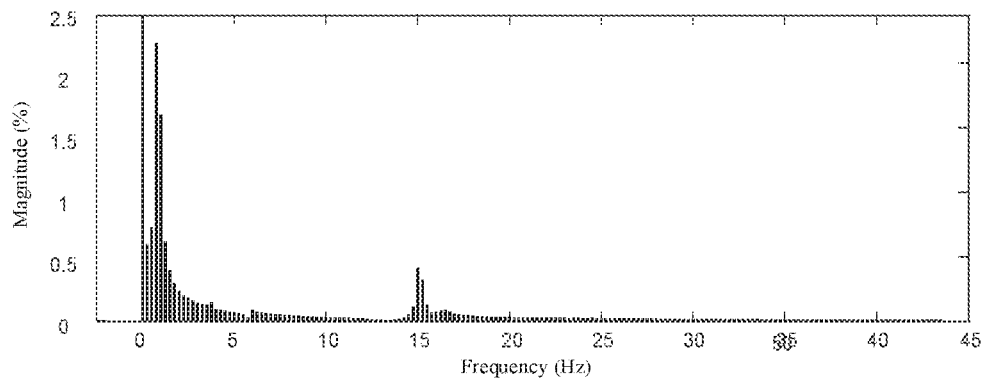
FIG. 14 illustrates FFT analysis results of the measurement data in FIG. 13.

The SSOs are observed in the active power output from wind turbine generators, for example that from PMSG-1 shown in FIG. 13 (c). The FFT analysis results are displayed in FIG. 14. From FIG. 14, it can be concluded that the SSO frequency in the power system is 15 Hz, i.e. $f_s$=15 Hz 2. Design a Parallel Band-Pass Filter Step 3: designing a parallel band-pass filter.

Design a parallel band-pass filter to ensure that the signal at frequency 15 Hz can pass through to earth, the signals at other frequencies are suppressed. Subsequently, dynamic interactions between the wind turbine generators and the power system at the SSO frequency $f_s$ are suppressed and filtered out; whilst at other frequencies are not affected. A 4th order band-pass filter is designed by Besself method as shown by Eq. (22), where the cut-off frequencies are 14 Hz and 16 Hz.

$$G_T(s) = \frac{4s^2}{s^4 + 3.4641s^3 + 452s^2 + 775.96s + 50176} \quad (22)$$

Figure 15:
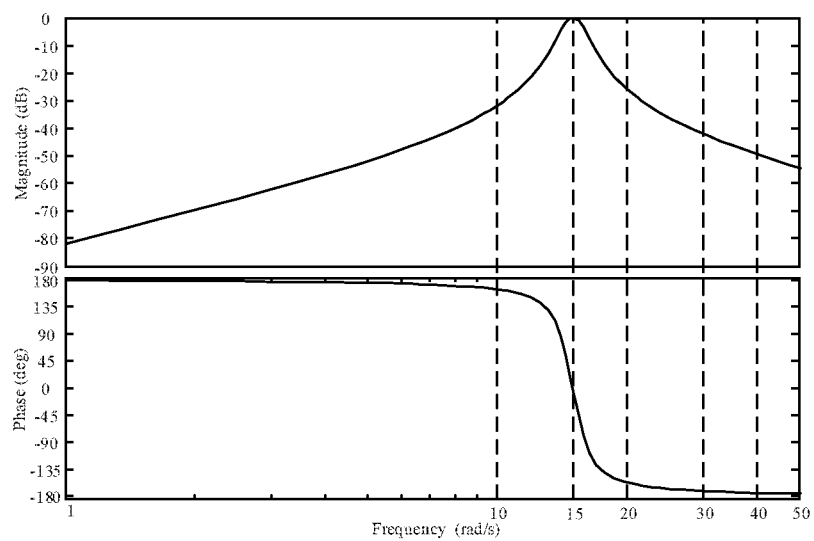
FIG. 15 illustrates magnitude-frequency and phase-frequency characteristics of the high-pass filter.

Results of magnitude-frequency and phase-frequency characteristics of the filter designed by Eq. (22) are shown in FIG. 15. From FIG. 15, it can be concluded that the filter designed by Eq. (22) can meet the requirement.

Step 4: verifying the effectiveness of the parallel band-pass filter designed in the step 3.

Figure 16B:
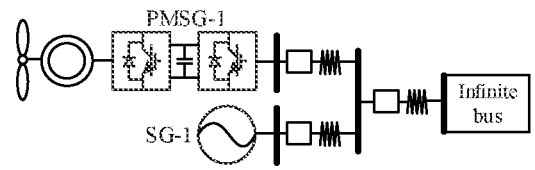
FIG. 16(b) illustrates configuration of single-machine infinite power system integrated with a wind turbine generator and the parallel band-pass filter.

A single-machine infinite-bus power system installed with PMSG-1 is shown by FIG. 16(a). It is used to verify the effectiveness of the parallel band-pass filter. FIG. 16(b) shows that the parallel band-pass filter is installed at the interface between the PMSG-1 and remainder of the power system (ROPS).

Figure 16B:
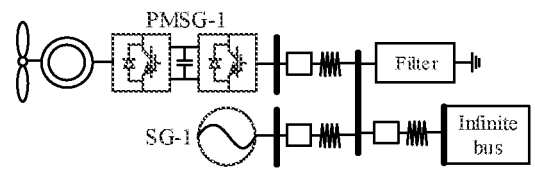
Figure 17A:
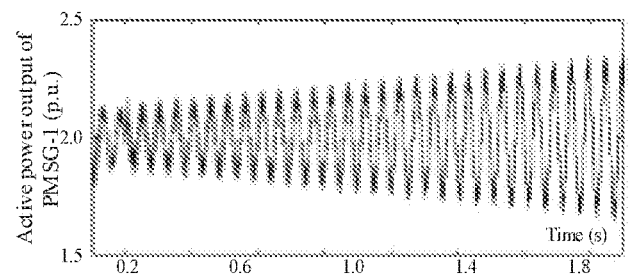
FIG. 17(a) illustrates active power output from wind turbine generator without the parallel band-pass filter.
Figure 17B:
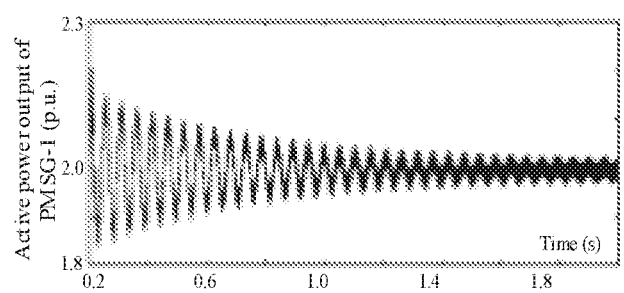
FIG. 17(b) illustrates active power output from wind turbine generator with the parallel band-pass filter.

When the SSOs occur in the power system of FIG. 16(*a*), the SSO frequency is calculated to be 15 Hz from the measurement data of active power output from PMSG-1. After the parallel band-pass filter is installed, the active power output from PMSG-1 is measured which is shown in FIG. 17(*b*). By comparing FIG. 17(*b*) and FIG. 17(*a*), it can be seen that the 15 Hz component in the variation of active power output from PMSG-1 is reduced effectively. Therefore, the effectiveness of the parallel band-pass filter is verified.

3. Measure Open-Loop Residues

Open-loop residues of each wind turbine generator represented by either PMSG or DFIG and the ROPS can be measured by installing a parallel band-pass filter at the PCC of each wind turbine generator.

Step 5: installing a parallel band-pass filter on the side of PMSG-1 and measure the residues.

Figure 18:
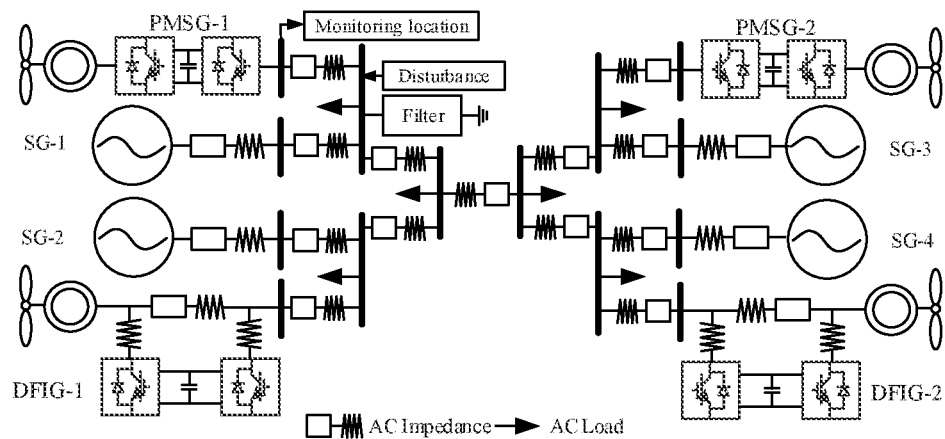
FIG. 18 illustrates installation location (1) of the high-pass filter.
Figure 19:
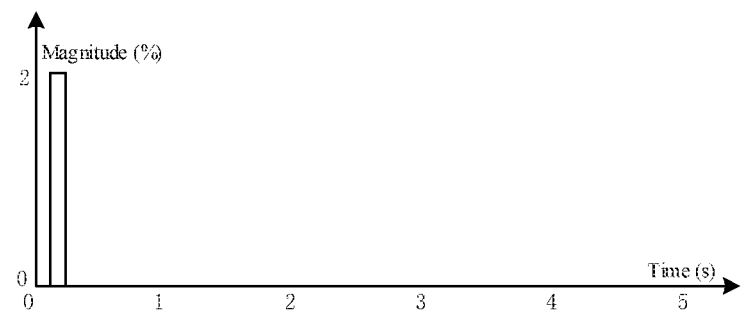
FIG. 19 illustrates typical disturbance signal.
Figure 20A:
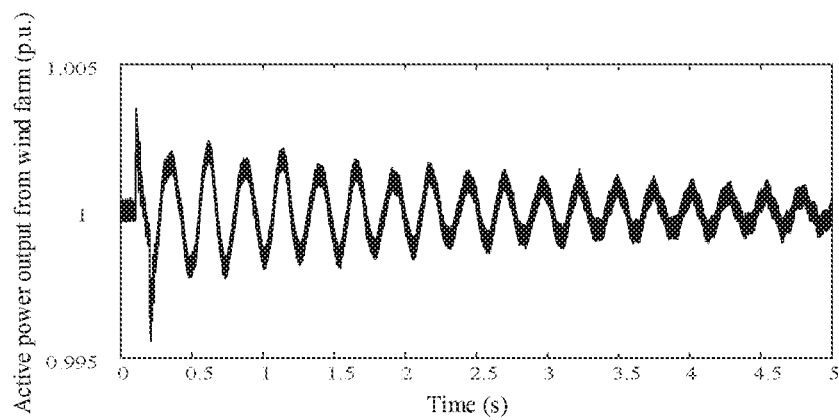
FIG. 20(a) illustrates active power output from the wind turbine generator before filtering.
Figure 20B:
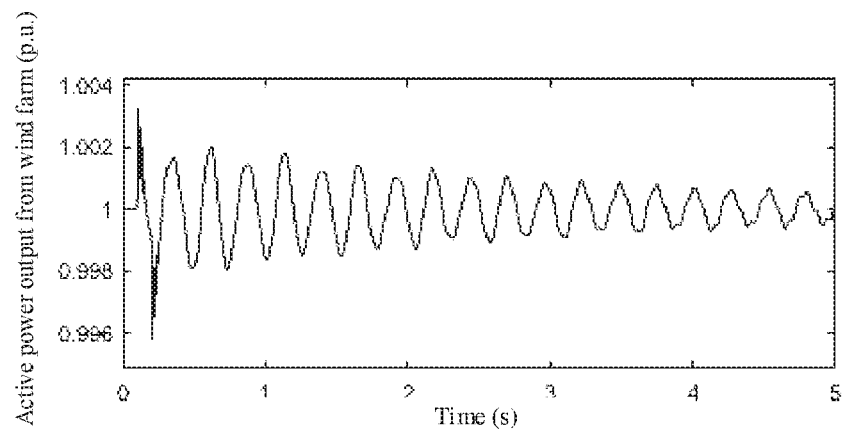
FIG. 20(b) illustrates active power output from the wind turbine generator after filtering.

The installing location of the band-pass filter, the place to inject the disturbance signal and to gain the measurement data are indicated in FIG. 18. The disturbance signal is 2% increase of magnitude of PCC voltage for 0.1 second as shown by FIG. 19. The measurement data gained on the side of PMSG-1 is shown by FIG. 20(*a*). With the noise being reduced, the same measurement data is shown in FIG. 20(*b*).

Prony analysis is applied to the measurement data shown by FIG. 20(*b*) to obtain the residue of PMSG-1 to be −0.0001+0.0003j.

Figure 21:
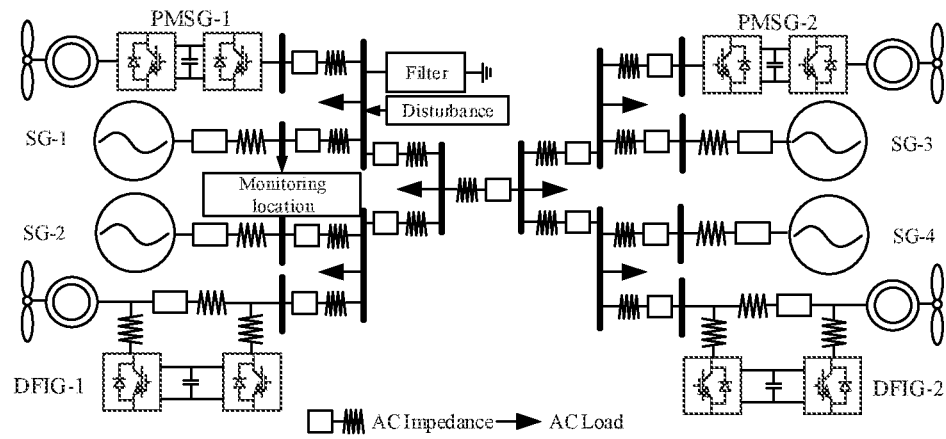
FIG. 21 illustrates point for injecting the disturbance signal and measuring signal.

Similarly, in order to measure the residue of the ROPS subsystem, the parallel band-pass filter is installed on the side of power system near PMSG-1. The installing location of the band-pass filter, the place to inject the disturbance signal and to gain the measurement data are indicated in FIG. 21. The disturbance signal is the same to that shown by FIG. 19. The measurement data gained on the side of power system and noise reduced data are shown in FIG. 22(*a*) and FIG. 22(*b*), respectively.

Figure 22A:
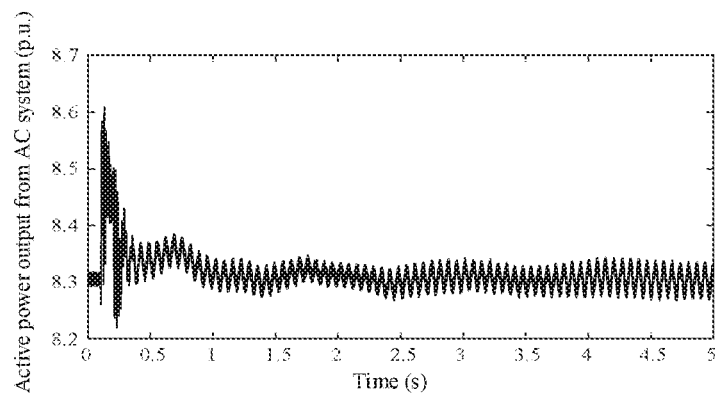
FIG. 22(a) illustrates active power output from AC system before filtering.
Figure 22B:
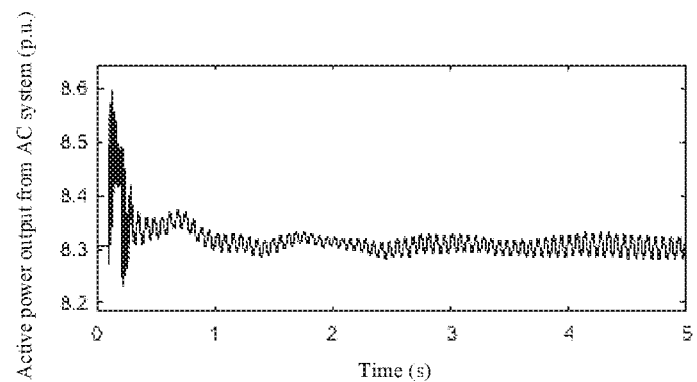
FIG. 22(b) illustrates active power output from AC system after filtering.
Figure 23:
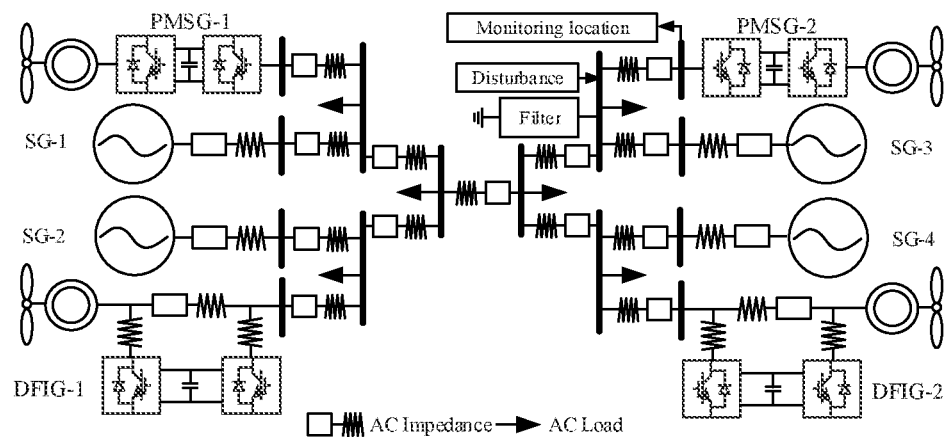
FIG. 23 illustrates installation location (2) of the high-pass filter.

From the measurement data displayed in FIG. 22(*b*), the residue of the ROPS subsystem is estimated by the Prony analysis to be −0.0441+0.0473j.

Step 6: installing a parallel band-pass filter on the side of PMSG-2 and measure the residues.

Figure 24A:
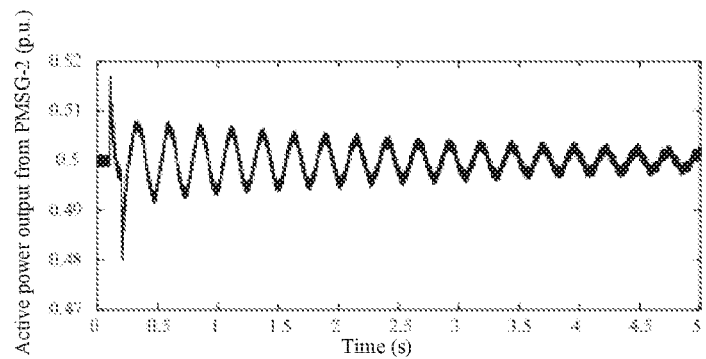
FIG. 24(a) illustrates active power output from the wind turbine generator before filtering.
Figure 24B:
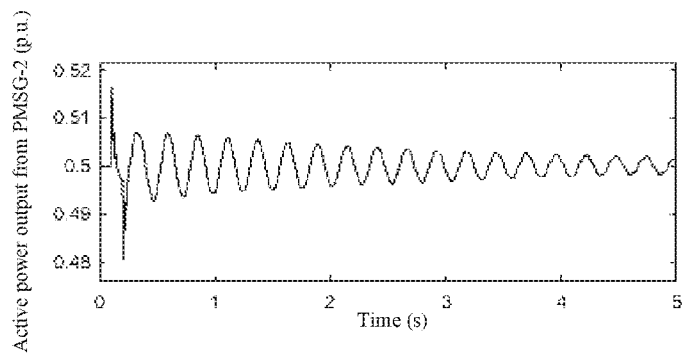
FIG. 24(b) illustrates active power output from the wind turbine generator after filtering.
Figure 25:
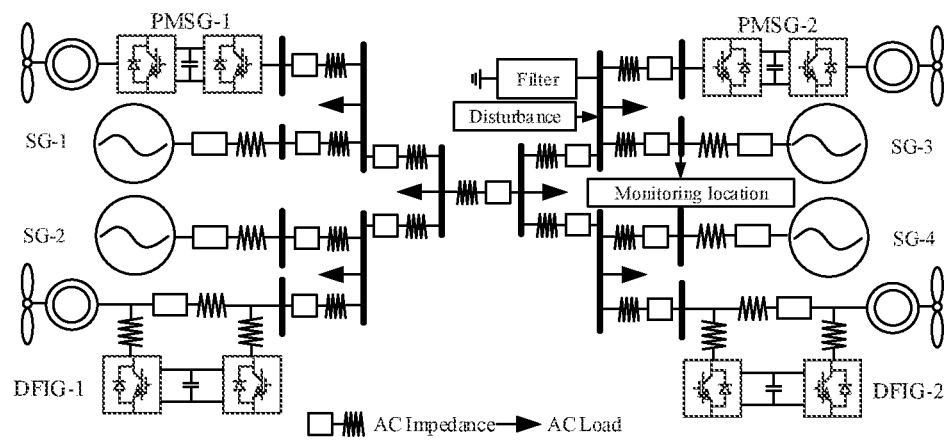
FIG. 25 illustrates points for injecting the disturbance signal and measuring signal.

The procedure to measure the residues for PMSG-2 is as same as that presented above in the step 5 for PMSG-1. The measurement data on the side of PMSG-2 and the noise reduced data are shown in FIG. 24(*a*) and FIG. 24(*b*). The residue of PMSG-1 is obtained to be −0.0001+0.0003j.

Figure 26A:
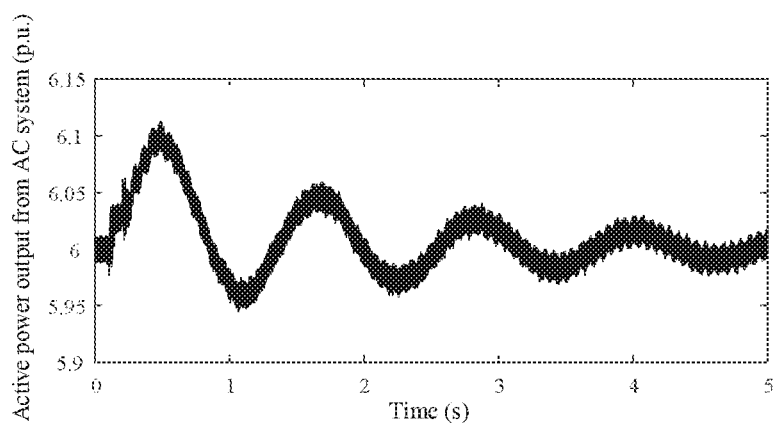
FIG. 26(a) illustrates active power output from AC system before filtering.
Figure 26B:
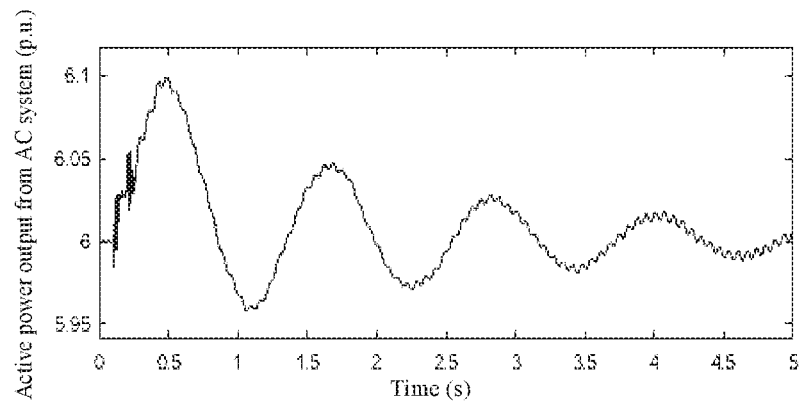
FIG. 26(b) illustrates active power output from AC system after filtering.
Figure 27:
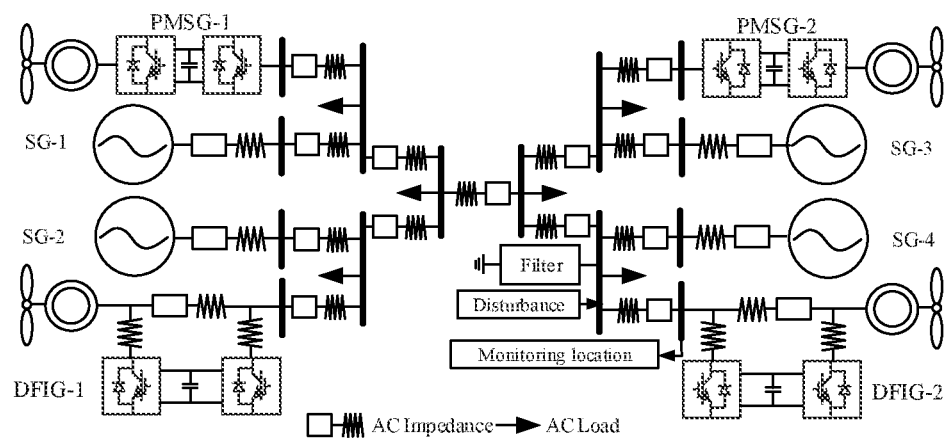
FIG. 27 illustrates installation location (3) of the high-pass filter.

The measurement data and noise reduced data on the side of power system are shown by FIG. 26(*a*) and FIG. 26(*b*) respectively. The residue of the ROPS subsystem is obtained to be −0.0820+0.0405j.

Step 7: installing a parallel band-pass filter on the side of DFIG-2 and measure residues.

Figure 28A:
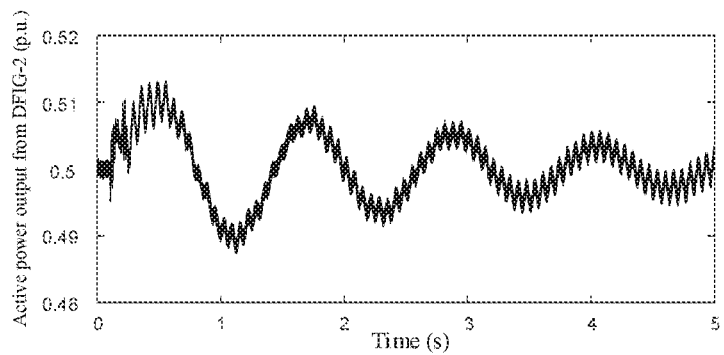
FIG. 28(a) illustrates active power output from the wind turbine generator before filtering.
Figure 28B:
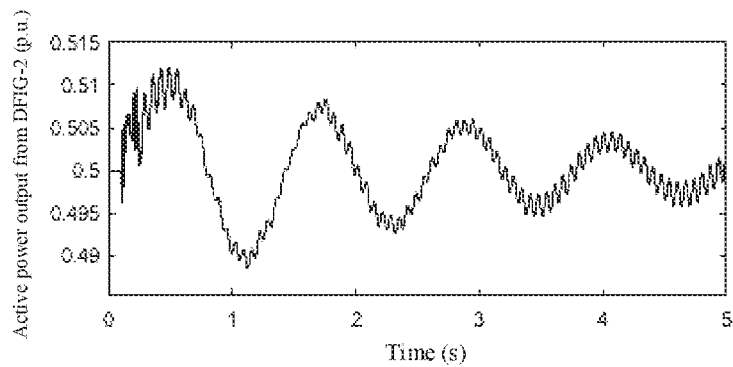
FIG. 28(b) illustrates active power output from the wind turbine generator after filtering.
Figure 29:
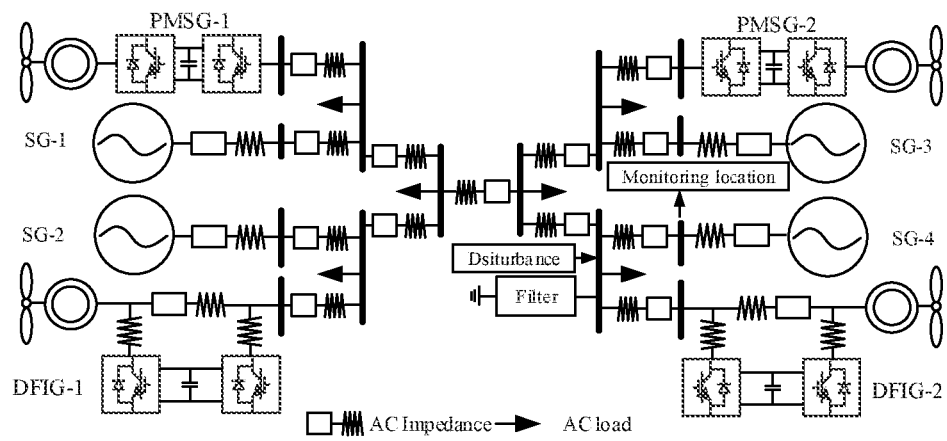
FIG. 29 illustrates points for injecting the disturbance signal and measuring signal.

The procedure to measure the residues for DFIG-2 is as same as that presented above in the step 5 for PMSG-1. The measurement data on the side of DFIG-2 and the noise reduced data are shown in FIG. 28(*a*) and FIG. 28(*b*). The residue of DFIG-2 is obtained to be 0.0003+0.0006j.

Figure 30A:
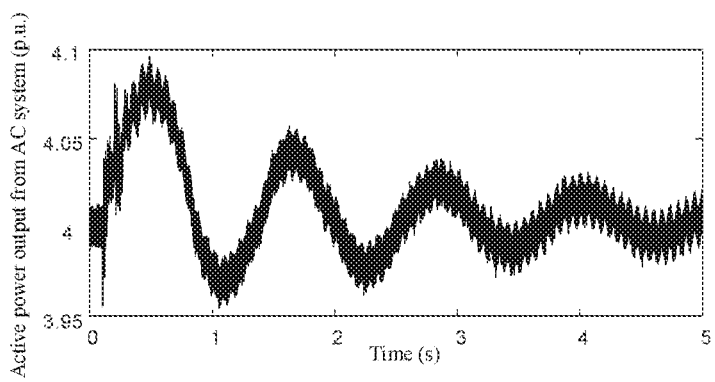
FIG. 30(a) illustrates active power output from AC system before filtering.
Figure 30B:
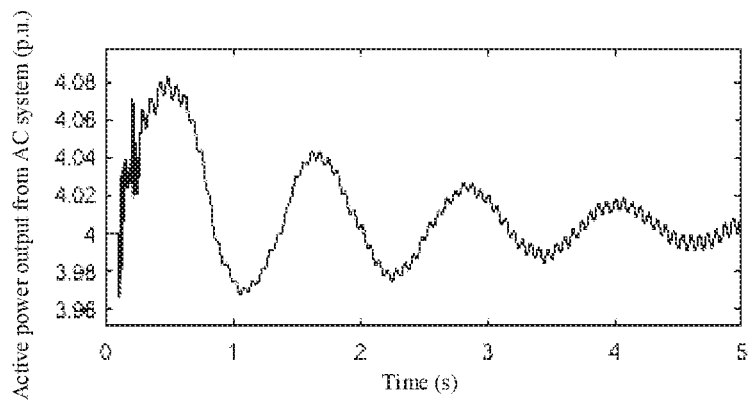
FIG. 30(b) illustrates active power output from AC system after filtering.
Figure 31:
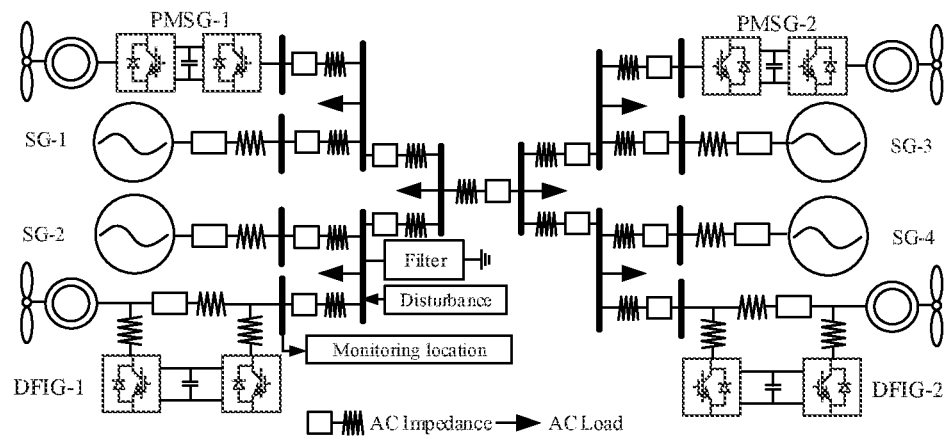
FIG. 31 illustrates installation location (4) of the high-pass filter.

The measurement data and noise reduced data on the side of power system are shown by FIG. 30(*a*) and FIG. 30(*b*) respectively. The residue of the ROPS subsystem is obtained to be −0.0502+0.0413j.

Step 8: installing a parallel band-pass filter on the side of DFIG-1 and measure residues.

Figure 32A:
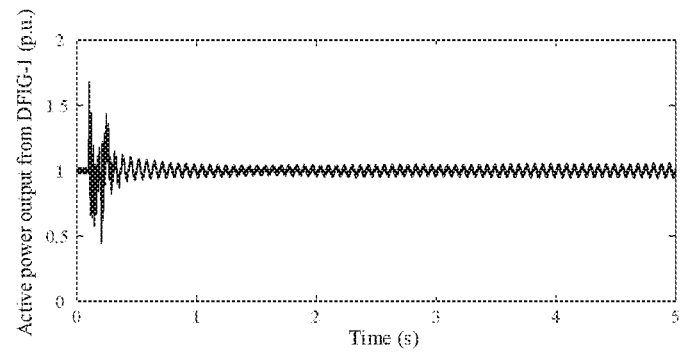
FIG. 32(a) illustrates active power output from the wind turbine generator before filtering.
Figure 32B:
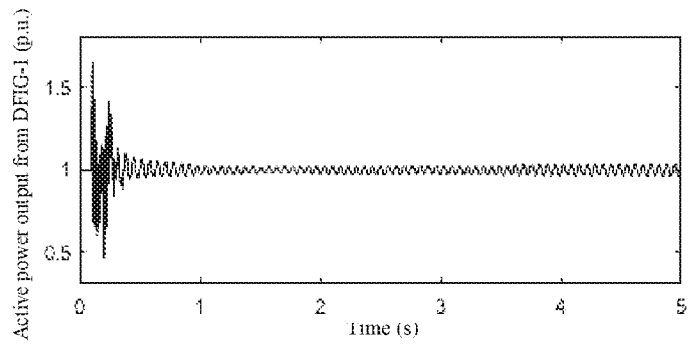
FIG. 32(b) illustrates active power output from the wind turbine generator after filtering.
Figure 33:
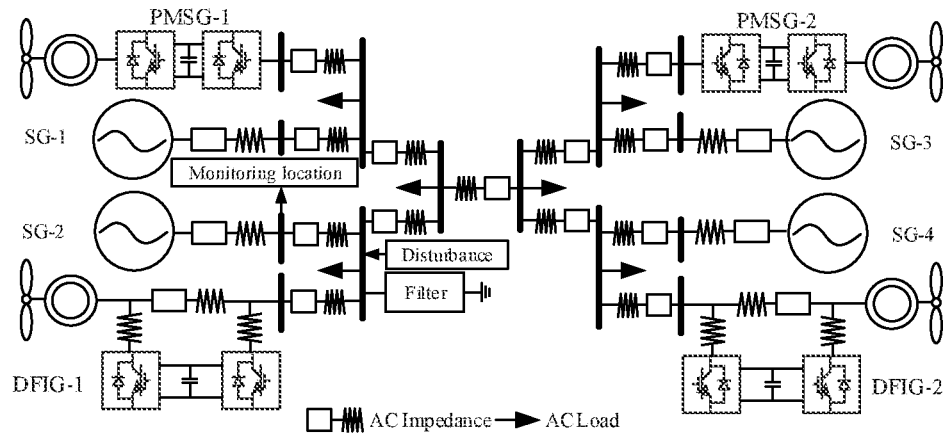
FIG. 33 illustrates points for injecting the disturbance signal and measuring signal.

The procedure to measure the residues for DFIG-1 is as same as that presented above in the step 5 for PMSG-1. The measurement data on the side of DFIG-1 and the noise reduced data are shown in FIG. 32(*a*) and FIG. 32(*b*). The residue of DFIG-1 is obtained to be −0.0078+0.0050j.

Figure 34A:
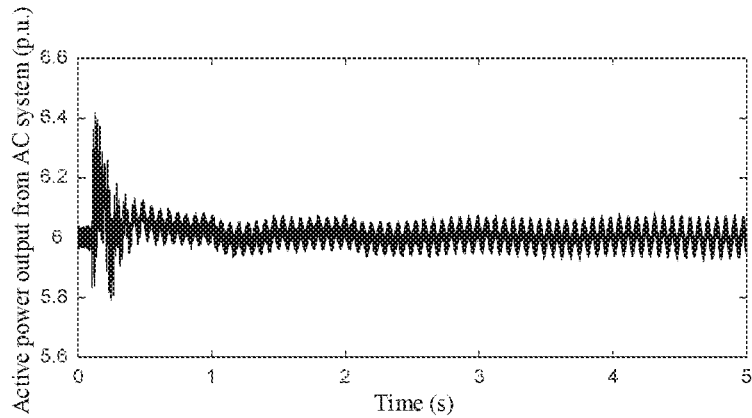
FIG. 34(a) illustrates active power output from AC system before filtering.
Figure 34B:
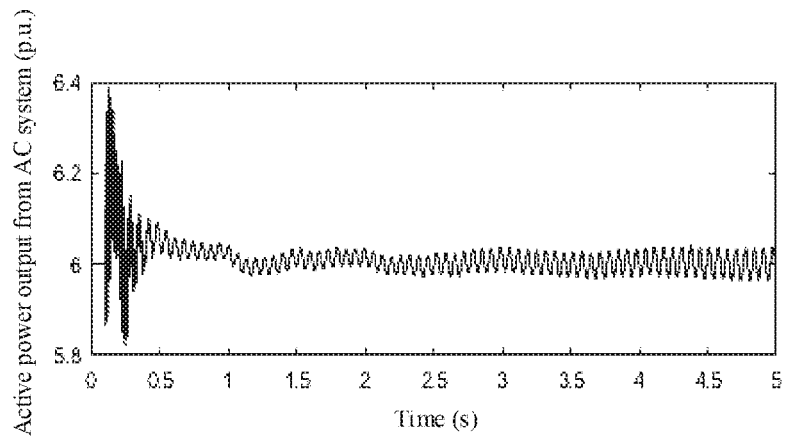
FIG. 34(b) illustrates active power output from AC system after filtering.

The measurement data and noise reduced data on the side of power system are shown by FIG. 34(*a*) and FIG. 34(*b*) respectively. The residue of the ROPS subsystem is obtained to be −0.0976+0.0805j.

4. Identify the Wind Turbine Generators which Cause the SSOs According to the Index Step 9: calculating the indexes.

The indexes $Z_i = |\sqrt{R_i R_{ai}}|$, i=1, 2, 3, 4 are computed based on the residues obtained above, where $R_i$ and $R_{ai}$, i=1, 2, 3, 4 are the residues of each wind turbine generator and the corresponding ROPS subsystem, respectively. The computational results are presented in Tab. 1-1.

TABLE 1-1

Results of residues and corresponding index obtained by using the present invention

| Index | Value | The cause of the SSOs |
| --- | --- | --- |
| Z4 (DFIG-1) | 0.0291 − 0.0016i | Yes |
| Z3 (DFIG-2) | 0.0054 − 0.0038i | No |
| Z1 (PMSG-1) | 0.0036 + 0.0052i | No |
| Z2 (PMSG-2) | 0.0055 + 0.0031i | No |

Step 10: identifying the wind turbine generator which causes the SSOs.

According to the open-loop modal resonance theory, the wind turbine generator corresponding to the maximum index among all Zi is identified to be the wind turbine generator causing the SSOs. Therefore, DFIG-1 is identified to be the cause of the SSOs in the four-machine two-area power system.

5. Verify the Correctness of Result Obtained by the Present Invention

Figure 1:
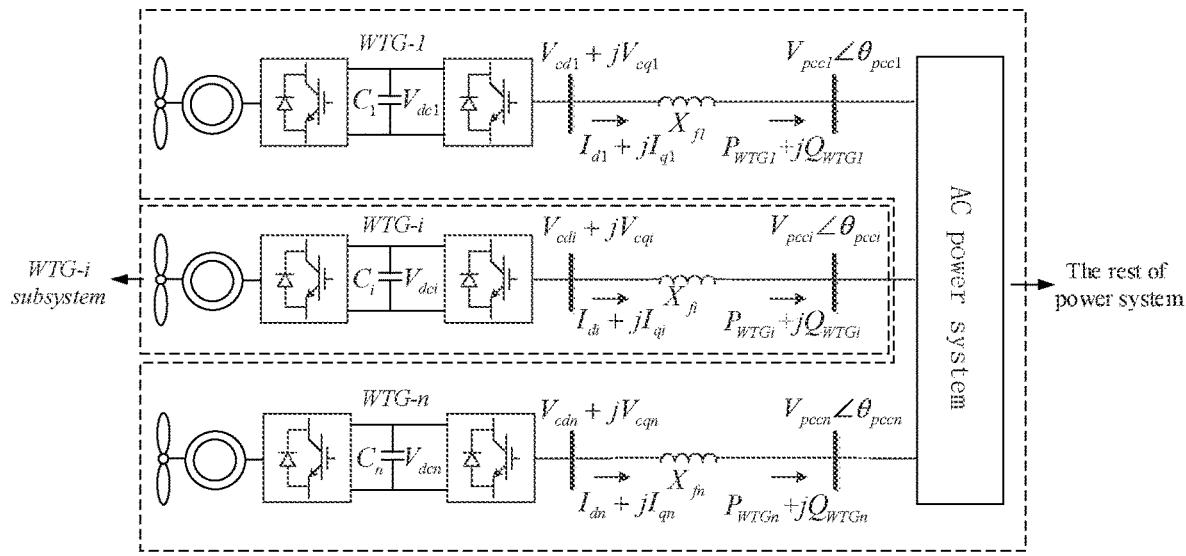
FIG. 1 illustrates configuration of the power system integrated with multiple WTGs.
Figure 2:
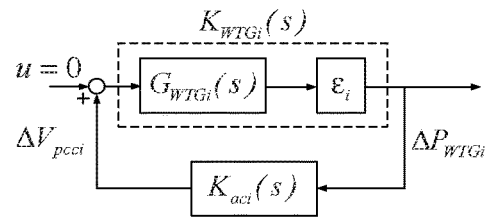
FIG. 2 illustrates closed-loop transform function of the power system integrated with multiple WTGs.
Figure 3:
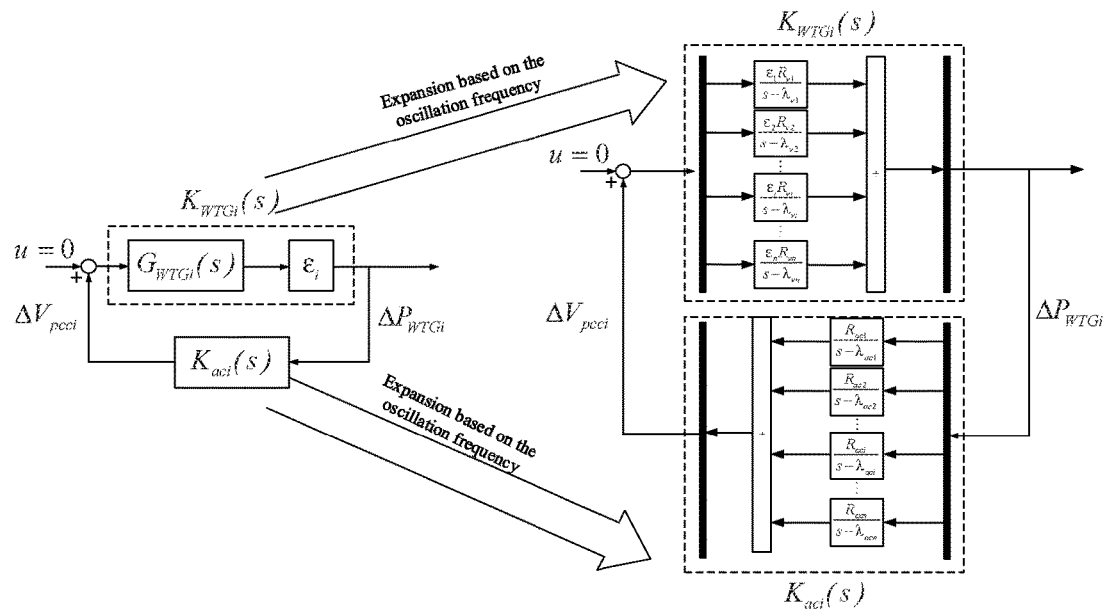
FIG. 3 illustrates expansion of power system by multiple oscillation modes and corresponding residues.
Figure 4:
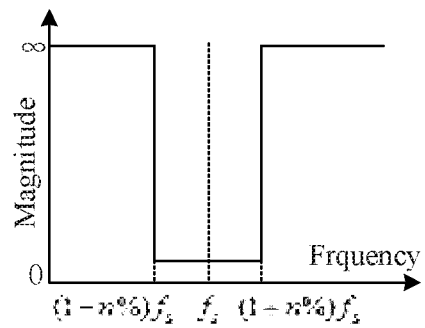
FIG. 4 illustrates magnitude-frequency characteristic of the ideal band-pass filter.
Figure 5:
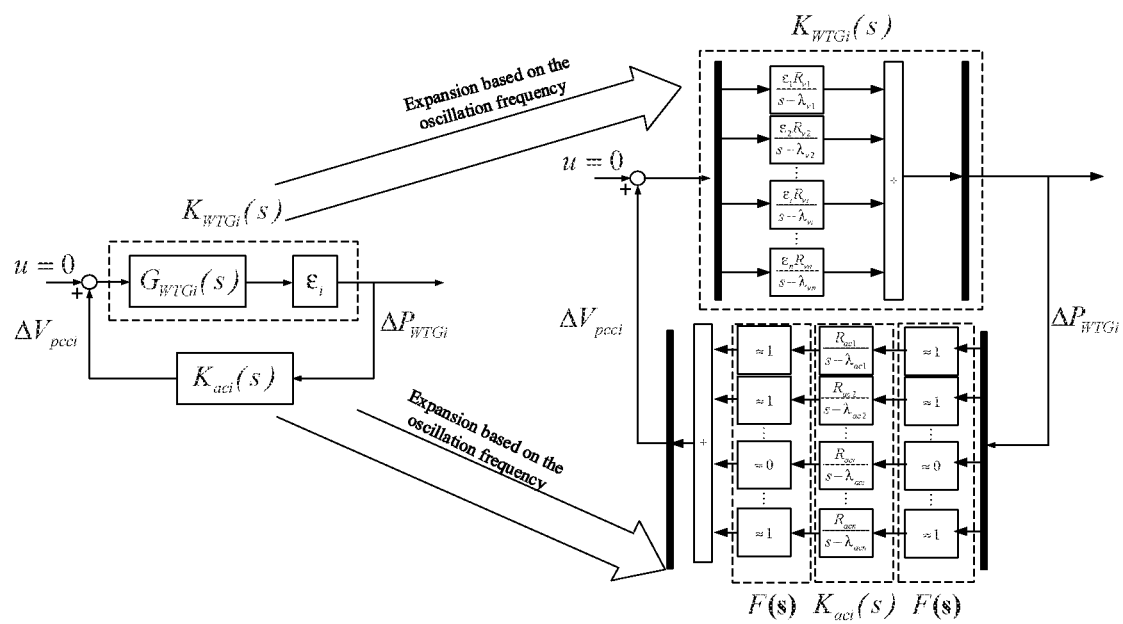
FIG. 5 illustrates expansion of the power system installed with the band-pass filter.
Figure 6:
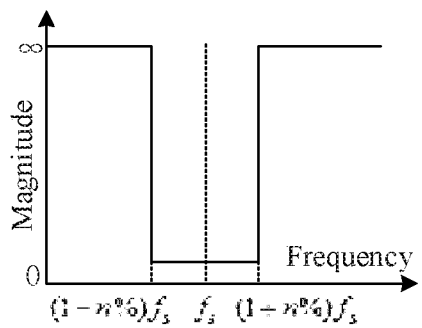
FIG. 6 illustrates magnitude-frequency characteristic of the ideal band-pass filter.
Figure 7:
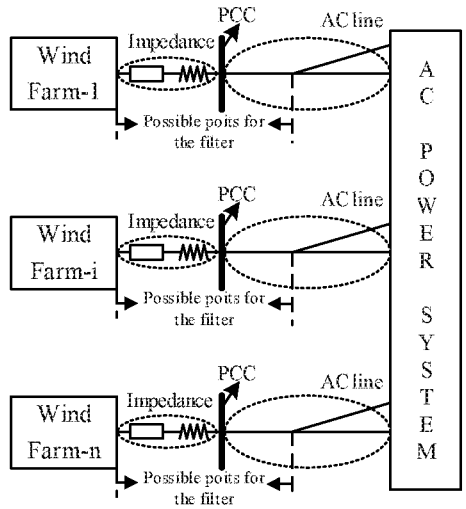
FIG. 7 illustrates points could be chosen to install filter in the step (3)
Figure 8:
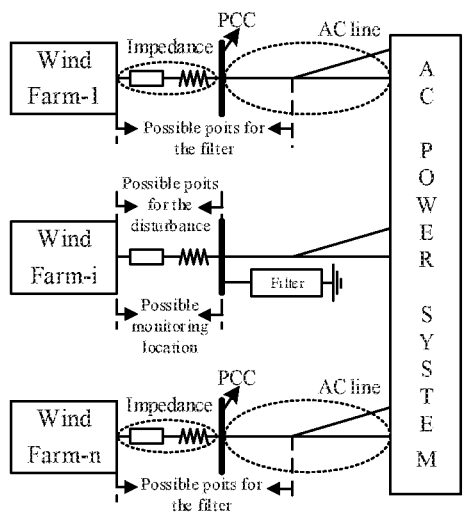
FIG. 8 illustrates points could be chosen to inject disturbance signal and monitor signal on the side of the i-th wind turbine generator in the step (4)
Figure 9:
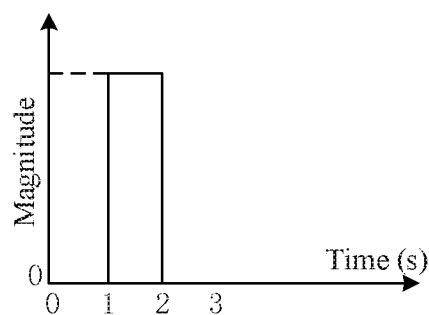
FIG. 9 illustrates the typical impulse signal in the step (4)
Figure 10:
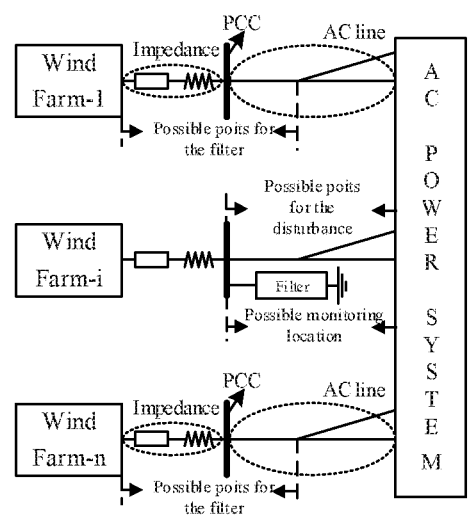
FIG. 10 illustrates points could be chosen to inject disturbance signal and measuring signal on the side of the power system in the step (6)

The linearized model of FIG. 9 is used in this section to verify the correctness of the above identification made by the present invention.

Step 11: establishing the parametric model of the power system integrated with the wind turbine generators.

The open-loop linearized models of each wind turbine generator subsystem and the corresponding ROPS subsystem described by Eq. (1) and Eq. (2) are respectively derived. Following notations are used to denote various results of derived parametric models and computational results.

$A_{dfi}$, $b_{dfi}$, $c_{dfi}$, i=1, 2 are the state matrix, control vector and output vector of open-loop state-space models of DFIG-1 and DFIG-2.

$p_{dfi}$, $r_{dfi}$, i=1, 2 are the left and right eigenvectors corresponding to the open-loop SSO modes of DFIG-1 and DFIG-2.

$A_{dfact}$, $b_{dfact}$, $c_{dfact}$, i=1, 2 are the state matrix, control vector and output vector of open-loop state-space models of the ROPS subsystem without DFIG-1 and DFIG-2 being included, respectively;

$p_{dfact}$, $r_{dfact}$, i=1.2 are the left and right eigenvectors corresponding to the open-loop SSO modes of ROPS subsystem without DFIG-1 and DFIG-2 being included, respectively;

$A_{pmi}$, $b_{pmi}$, $c_{pmi}$, i=1, 2 are the state matrix, control vector and output vector of open-loop state-space models of PMSG-1 and PMSG-2.

$p_{pmi}$, $r_{pmi}$, i=1, 2 are the left and right eigenvectors corresponding to the open-loop SSO modes of PMSG-1 and PMSG-2.

$A_{pmaci}$, $b_{pmaci}$, $c_{pmaci}$, i=1, 2 are the state matrix, control vector and output vector of the ROPS subsystem without PMSG-1 and PMSG-2 being included, respectively.

$p_{pmaci}$, $r_{pmaci}$, i=1, 2 are the left and right eigenvectors corresponding to the open-loop SSO modes of ROPS subsystem without PMSG-1 and PMSG-2 being included, respectively.

Step 12: calculating the residues of each open-loop wind turbine generator subsystem and corresponding open-loop ROPS subsystems.

From the results obtained in the step 11, the open-loop residues of DFIG-1 and the corresponding ROPS subsystem are calculated to be $R_{df1}=p_{df1}^T b_{df1} c_{df1} r_{df1}=-1.28+164.55i$ and $R_{dfac1}=p_{dfac1}^T b_{dfac1} c_{dfac1} r_{dfac1}=-0.019+0.009i$, respectively. Thus, the index associated with DFIG-1 is calculated to be $Z_{r4}=\sqrt{R_{df1}R_{dfac1}}=1.01-1.57i$.

Similarly, the open-loop residues of DFIG-2 and the corresponding ROPS subsystem are calculated to be $R_{df2}=p_{df2}^T b_{df2} c_{df2} r_{df2}=-1.38+130.01i$ and $R_{dfac2}=p_{dfac2}^T b_{dfac2} c_{dfac2} r_{dfac2}=-0.0061-0.002i$, respectively. The index associated with DFIG-2 is calculated to be $Z_{r3}=\sqrt{R_{df2}R_{dfac2}}=0.27-0.79i$.

The open-loop residues of PMSG-1 and the corresponding ROPS subsystem are calculated to be $R_{pm1}=p_{pm1}^T b_{pm1} c_{pm1} r_{pm1}=-3.03+17.2i$ and $R_{pmac1}=p_{pmac1}^T b_{pmac1} c_{pmac1} r_{pmac1}=-0.011+j0.006$, respectively. The index associated with PMSG-1 is calculated to be $Z_{r1}=\sqrt{R_{pm1}R_{pmac1}}=0.38+0.273i$.

The open-loop residues of PMSG-2 and the corresponding ROPS subsystem are calculated to be $R_{pm1}=p_{pm2}^T b_{pm2} c_{pm2} r_{pm2}=-25.78+23.33i$ and $R_{pmac2}=p_{pmac2}^T b_{pmac2} c_{pmac2} r_{pmac2}=-0.009+j0.002$, respectively. The index associated with PMSG-2 is calculated to be $Z_{r2}=\sqrt{R_{pm2}R_{pmac2}}=0.26+0.503i$ Step 13: verifying the correctness of result obtained in the step 10 by the present invention.

Computational results of indexes above by using the parametric model are listed in Table 1-2. It can be seen that DFIG-1 causes the SSOs, confirming the correctness of identification made previously from Table 1-1 by using the present invention.

TABLE 1-2

Results of residues and index obtained using the parametric model for confirmation

| Index | Method in the present invention | The cause of the SSOs | Parametric model method | The cause of the SSOs |
|---|---|---|---|---|
| Z4 (DFIG-1) | $Z_{b4}=1$ | Yes | $Z_{br4}=1$ | Yes |
| Z3 (DFIG-2) | $Z_{b3}=0.2268$ | No | $Z_{br3}=0.4521$ | No |
| Z1 (PMSG-1) | $Z_{b1}=0.2165$ | No | $Z_{br1}=0.2550$ | No |
| Z2 (PMSG-2) | $Z_{b2}=0.2165$ | No | $Z_{br2}=0.3063$ | No |

Figure 35:
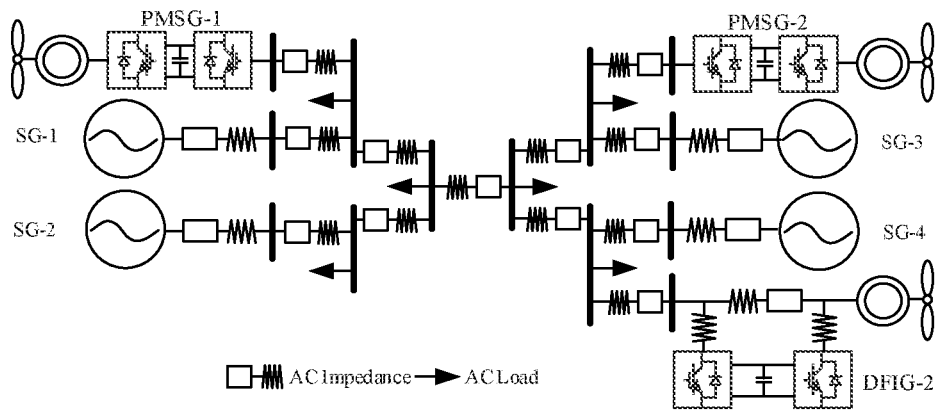
FIG. 35 illustrates configuration of the power system without DFIG-1
Figure 36:
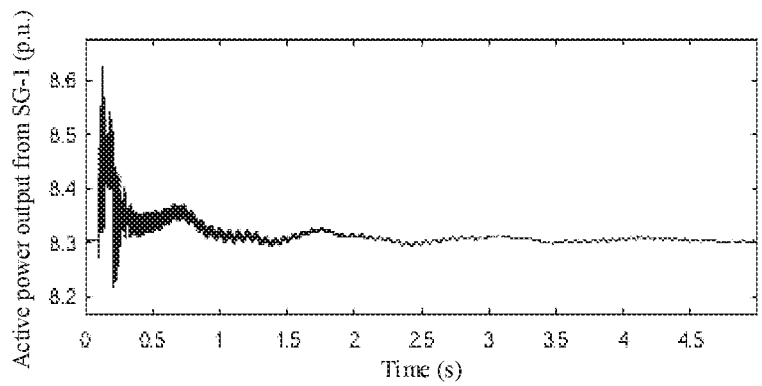
FIG. 36 illustrates active power output from SG-1 without DFIG-1.
Figure 37:
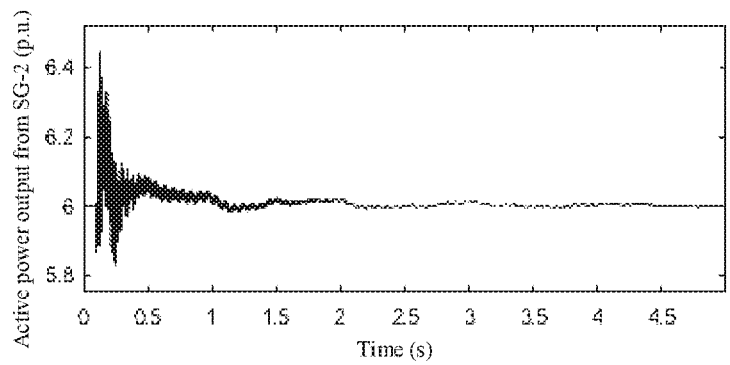
FIG. 37 illustrates active power output from SG-2 without DFIG-1.
Figure 38:
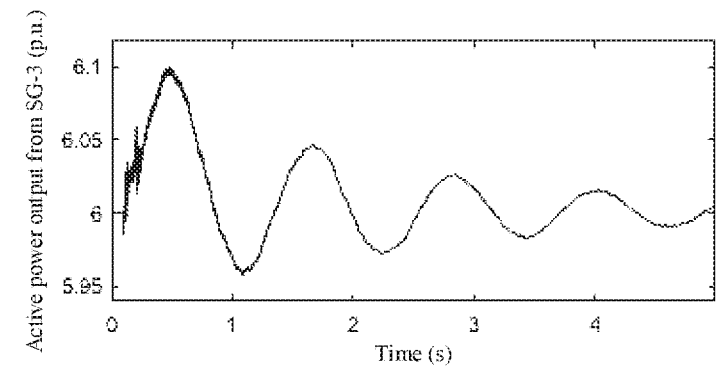
FIG. 38 illustrates active power output from SG-3 without DFIG-1.
Figure 39:
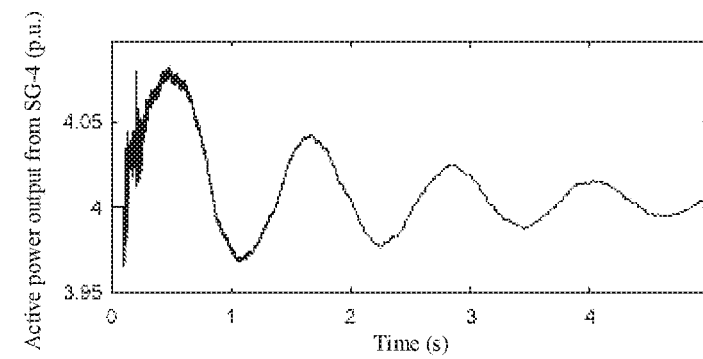
FIG. 39 illustrates active power output from SG-4 without DFIG-1.

DFIG-1 is disconnected from the example power system as shown by FIG. 35. Simulation results are shown from FIG. 36 to FIG. 39. It can be seen that no SSOs occur in the example power system, confirming that DFIG-1 causes the SSOs as identified by the present invention.

EXAMPLE 2

Figure 40:
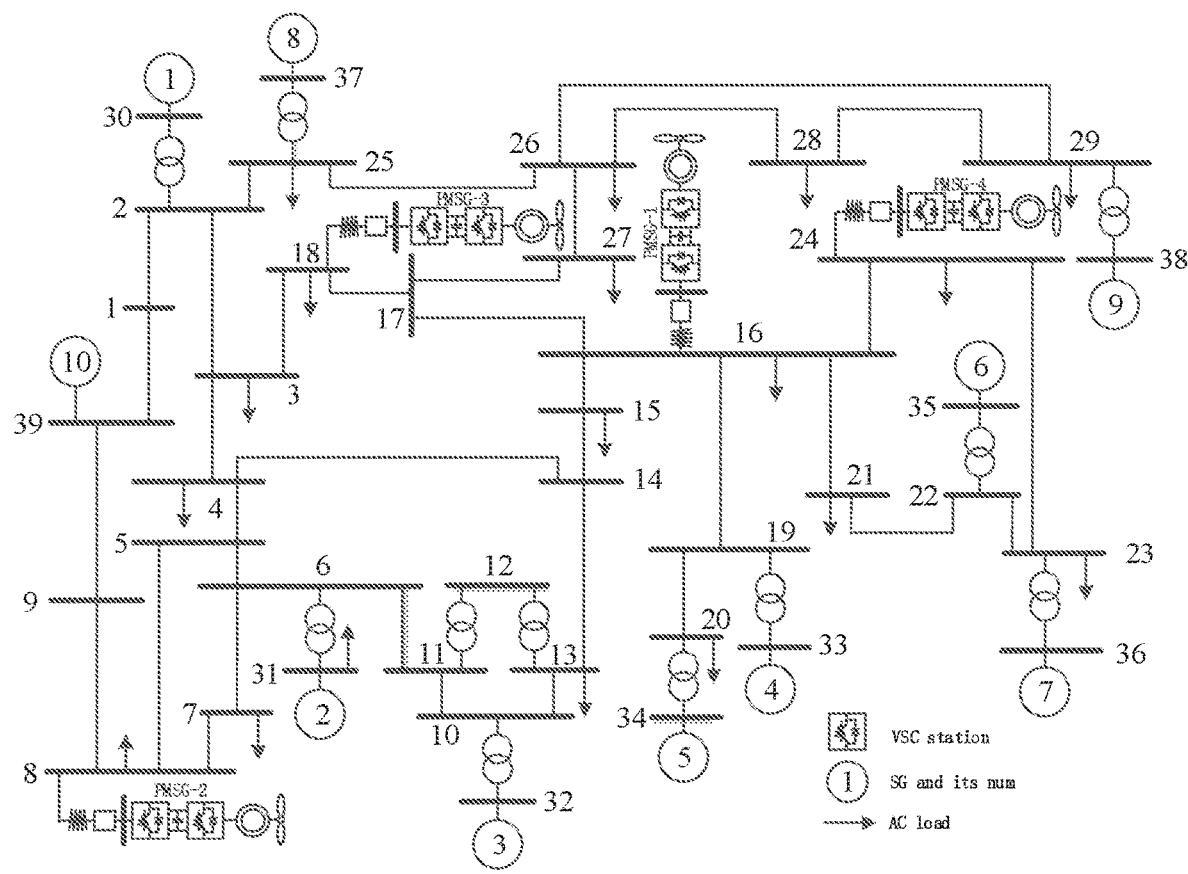
FIG. 40 illustrates configuration of the complex power system integrated with four wind turbine generators.

FIG. 40 shows a 10-machine 39-node New England power system integrated with four PMSGs, which represent four grid-connected wind farms. When the SSOs occur, the wind turbine generators which cause the SSOs in the power system are identified by the present invention without using the parametric model. Detailed steps of identification are as follows.

1. Determine the SSO Frequency

In order to identify the wind turbine generators which cause the SSOs, the SSO frequency in the power system needs to be determined firstly. Afterwards, the band-pass filter can be designed near this frequency.

Step 1: reducing the noise in the measurement data.

A low-pass filter depicted in FIG. 41 is designed to reduce the harmonic components in the measurement data.

Step 2: determining the SSO frequency by the signal processing method.

Figure 41A:
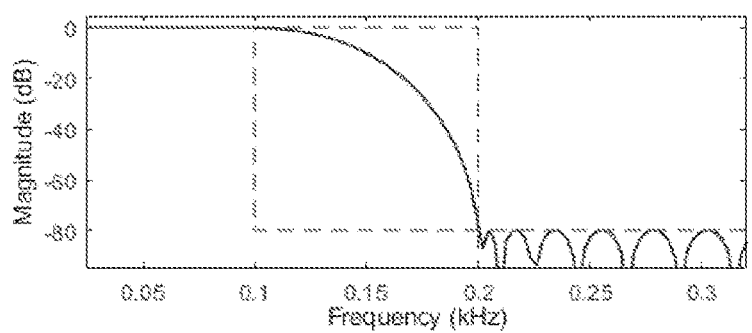
FIG. 41(a) illustrates magnitude-frequency characteristic of the low-pass filter.
Figure 41B:
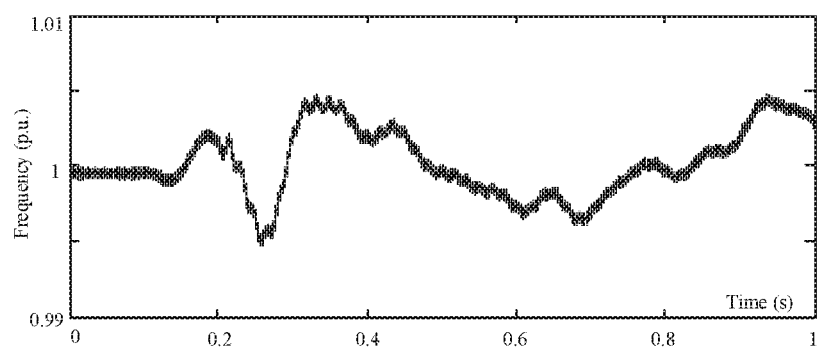
FIG. 41(b) illustrates frequency response of the power system before filtering.
Figure 41C:
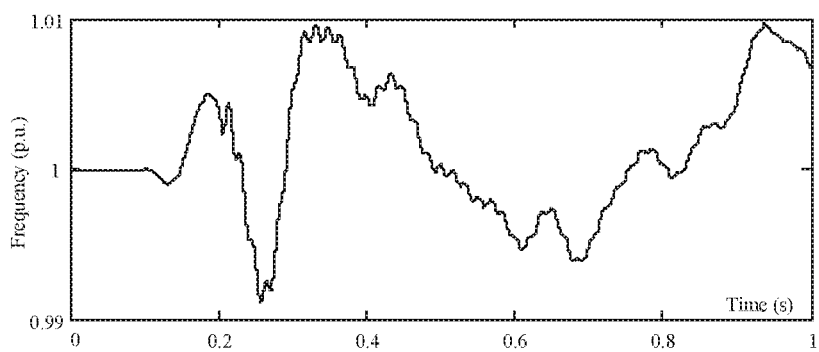
FIG. 41(c) illustrates frequency response of the power system after filtering.
Figure 42:
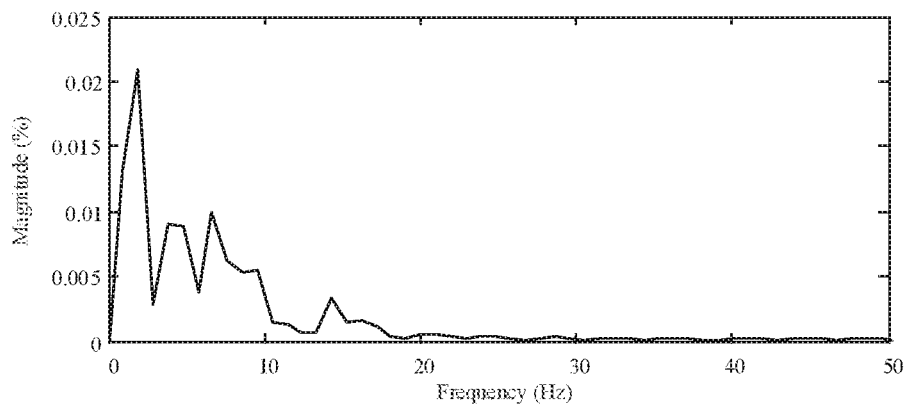
FIG. 42 illustrates FFT analysis results of the measurement data in FIG. 41.

The SSOs can be observed in frequency response curve in FIG. 41(a)-(c). The FFT analysis results are summarized in FIG. 42. From FIG. 42, it can be concluded that the SSO frequency in the power system is 14.5 Hz, i.e. f=14.5 Hz 2. Design a Parallel Band-Pass Filter Step 3: designing a parallel band-pass filter.

Figure 43:
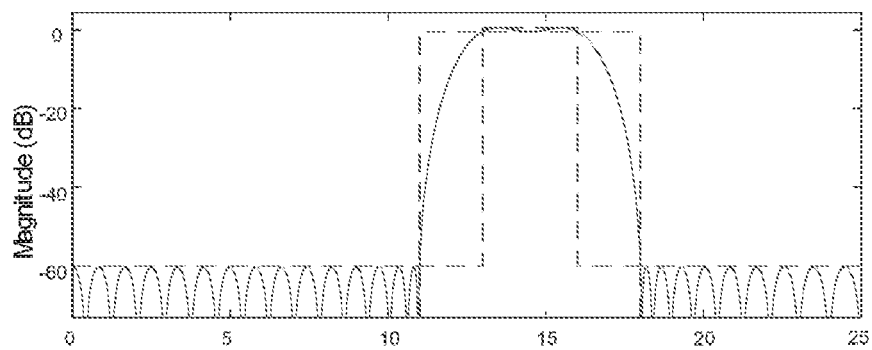
FIG. 43 illustrates magnitude-frequency and phase-frequency characteristics of the high-pass filter.

Design a parallel band-pass filter to ensure that the signal at frequency 14.5 Hz can pass through to earth, the signals at other frequencies are suppressed. Subsequently, dynamic interactions between the wind turbine generators and the power system at the SSO frequency $f_s$ are suppressed and filtered out; whilst at other frequencies are not affected. A 4th order band-pass filter is designed by Bessell method, where the cut-off frequencies are 14 Hz and 16 Hz. The analysis results of magnitude-frequency characteristics of the filter are shown in FIG. 43. From FIG. 43, it can be concluded that the designed filter can meet the requirement.

Step 4: verifying the effectiveness of the parallel band-pass filter designed in the step 3.

The procedure to verify the effectiveness of the parallel band-pass filter is the same as that presented above in the step 4 of example 1.

3. Measure Open-Loop Residues

Open-loop residues of each wind turbine generator represented by PMSG and the remainder of the ROPS can be measured by installing a parallel band-pass filter at the PCC of each wind turbine generator.

Step 5: installing a parallel band-pass filter on the side of PMSG-1 and measure the residues.

Figure 44:
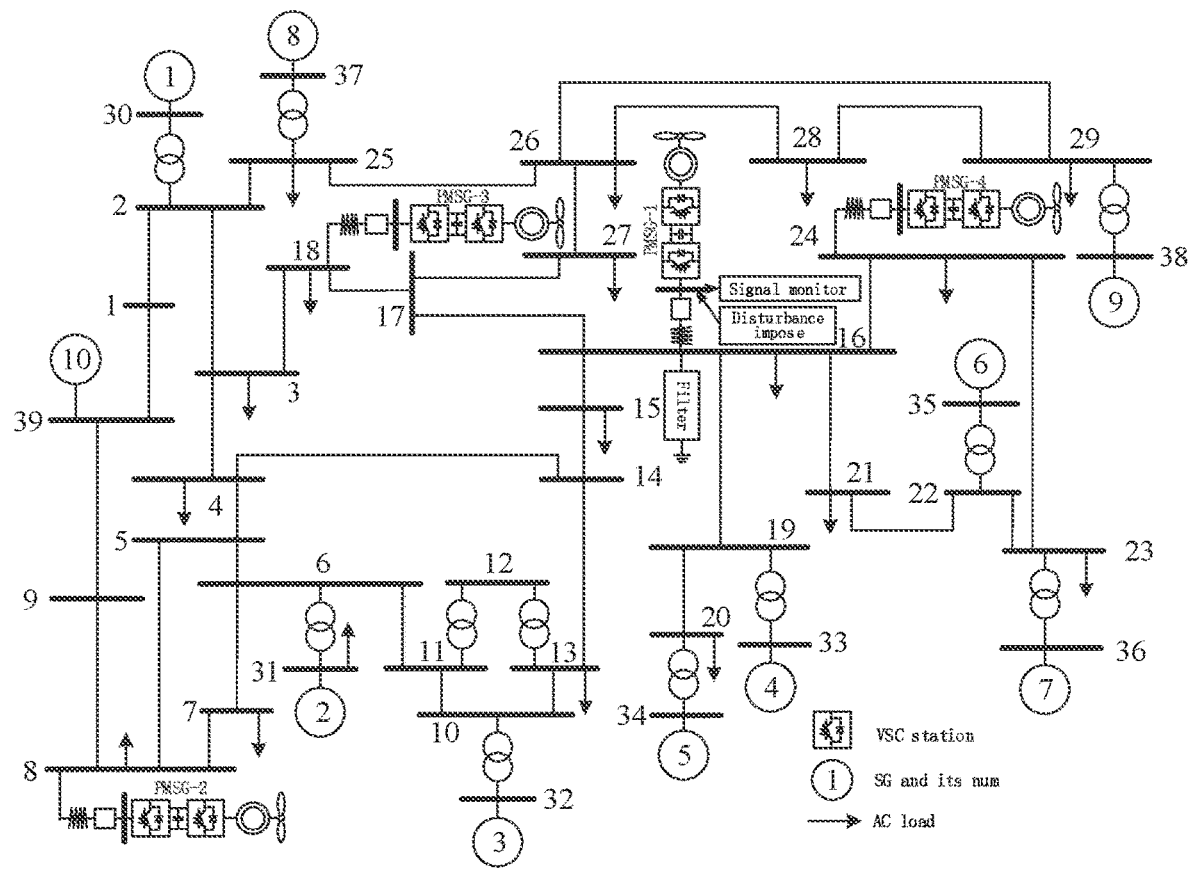
FIG. 44 illustrates installation location (1) of the high-pass filter.
Figure 45:
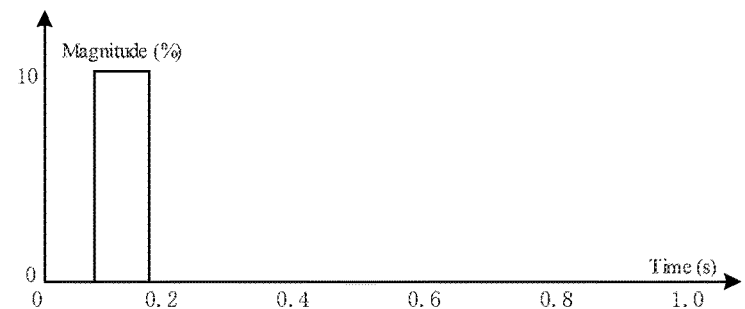
FIG. 45 illustrates the typical disturbance signal.
Figure 46A:
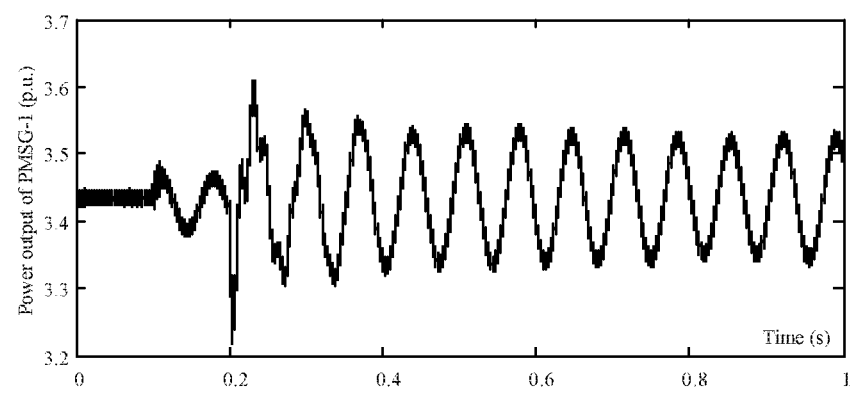
FIG. 46(a) illustrates active power output from PMSG-1 before filtering.

The installing location of the band-pass filter, the place to inject the disturbance signal and to gain the measurement data are indicated in FIG. 44. The disturbance signal is 10% increase of magnitude of PCC voltage for 0.1 second as shown by FIG. 45. The measurement data gained on the side of PMSG-1 is shown by FIG. 46(a). With the noise being reduced, the same measurement data is shown in FIG. 46(b).

Figure 46B:
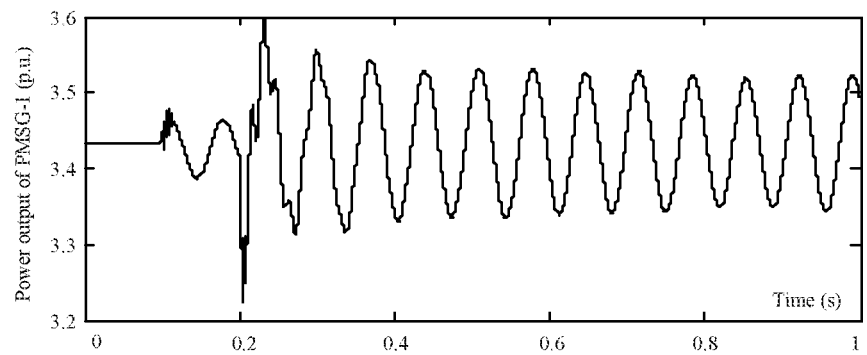
FIG. 46(b) illustrates active power output from PMSG-1 after filtering.

Prony analysis is applied to the measurement data shown by FIG. 46(b) to obtain the residue of PMSG-1 to be 0.0183+0.0497.

Figure 47:
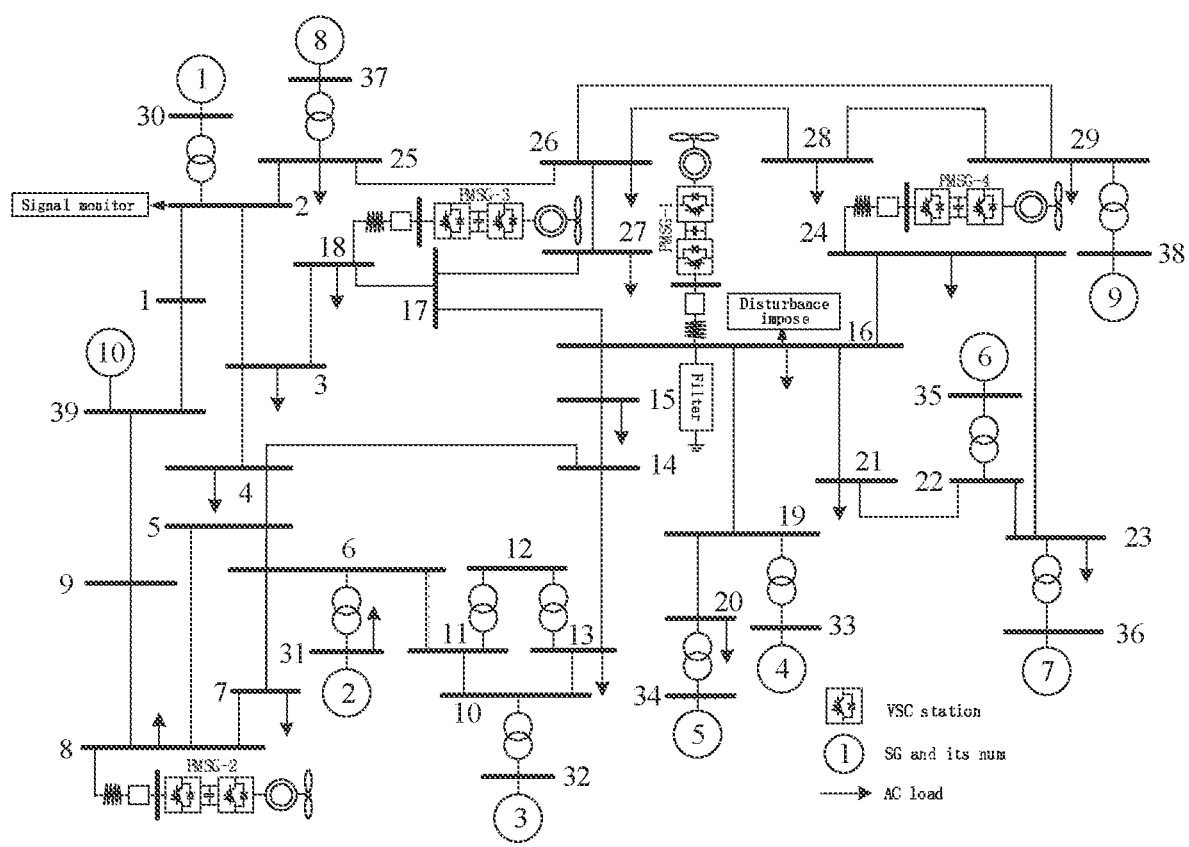
FIG. 47 illustrates points for injecting the disturbance signal and measuring signal.
Figure 48A:
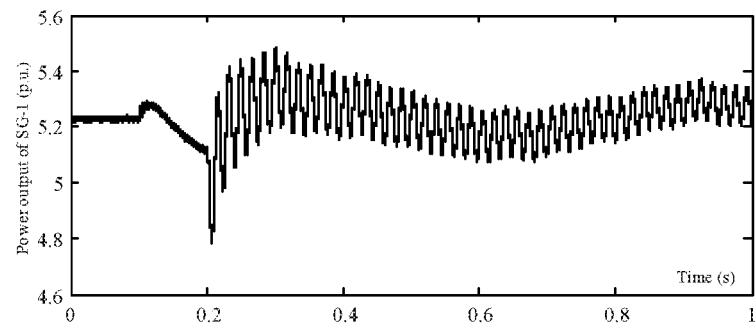
FIG. 48(a) illustrates active power output from SG-1 before filtering.

Similarly, in order to measure the residue of the ROPS subsystem, the parallel band-pass filter is installed on the side of power system near PMSG-1. The installing location of the band-pass filter, the place to inject the disturbance signal and to gain the measurement data are indicated in FIG. 47. The disturbance signal is the same as that shown by FIG. 45. The measurement data gained on the side of power system and noise reduced data are shown in FIG. 48(a) and FIG. 48(b) respectively.

Figure 48B:
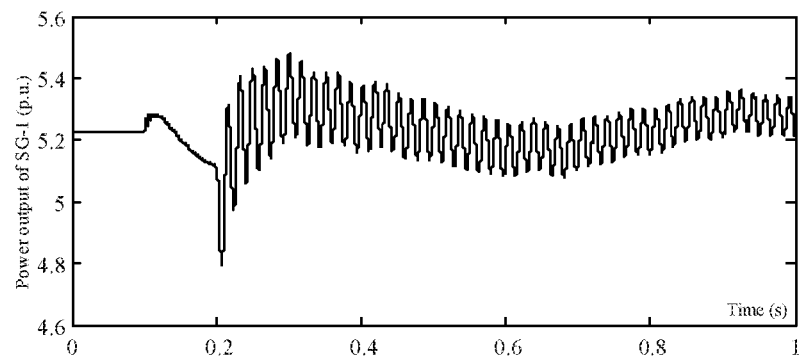
FIG. 48(b) illustrates active power output from SG-2 after filtering
Figure 49:
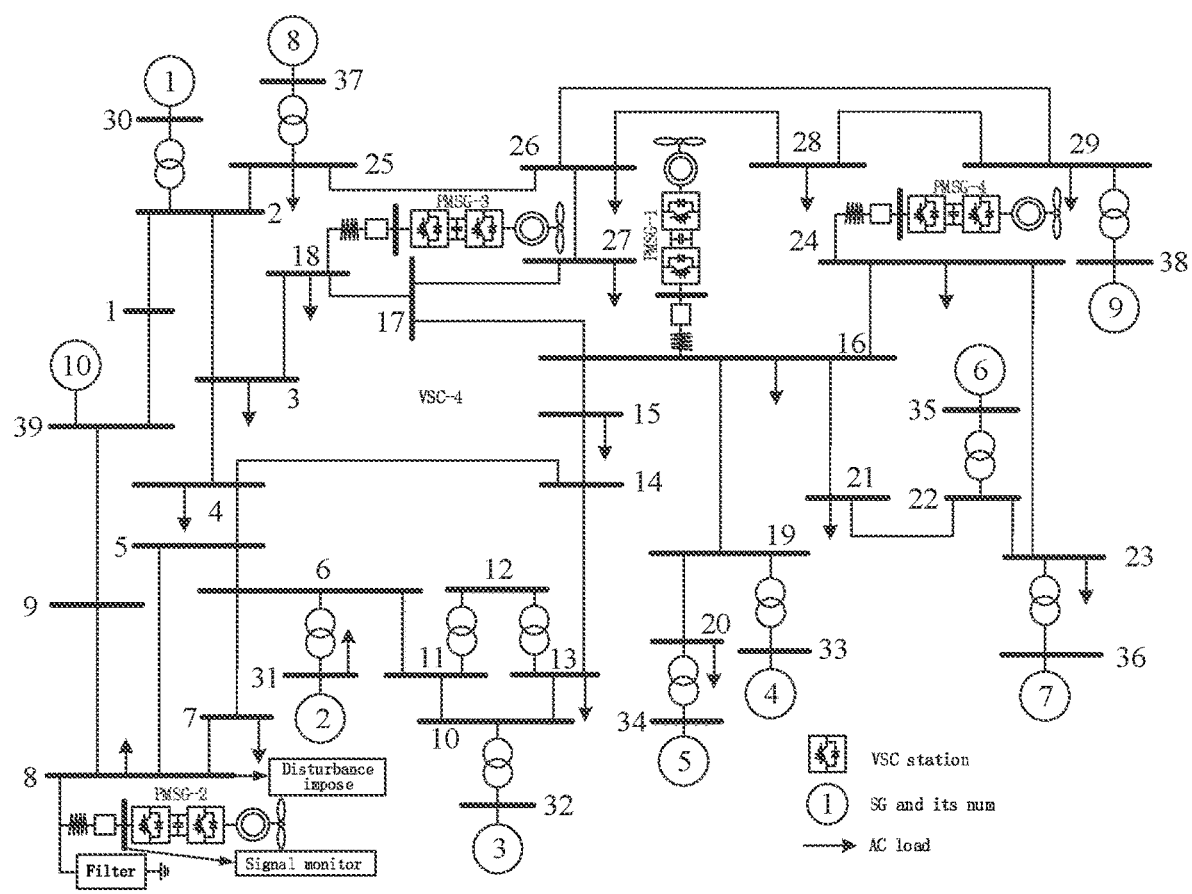
FIG. 49 illustrates installation location (2) of the high-pass filter.

From the measurement data displayed in FIG. 48(b), the residue of the ROPS subsystem is estimated by the Prony analysis to be 0.0020+0.0026j.

Step 6: installing a parallel band-pass filter on the side of PMSG-2 and measure the residues.

Figure 50A:
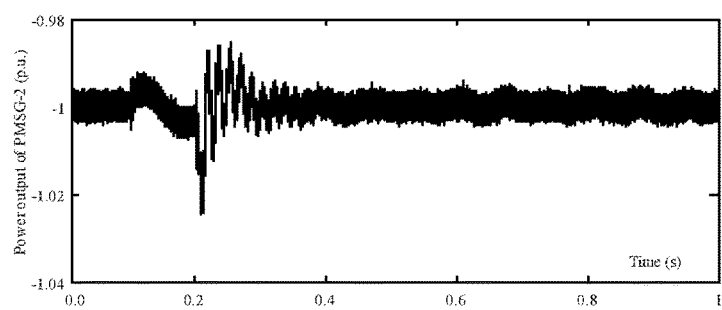
FIG. 50(a) illustrates active power output from PMSG-2 before filtering.
Figure 50B:
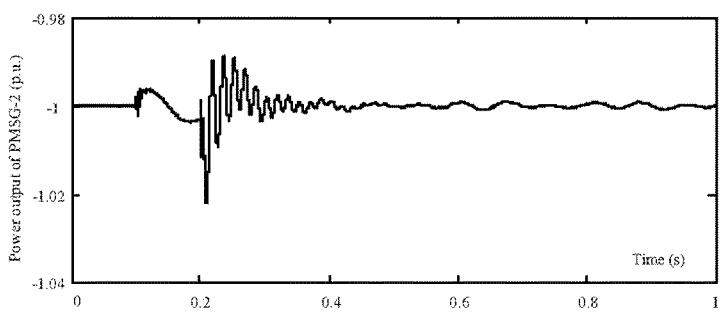
FIG. 50(b) illustrates active power output from PMSG-2 after filtering.
Figure 51:
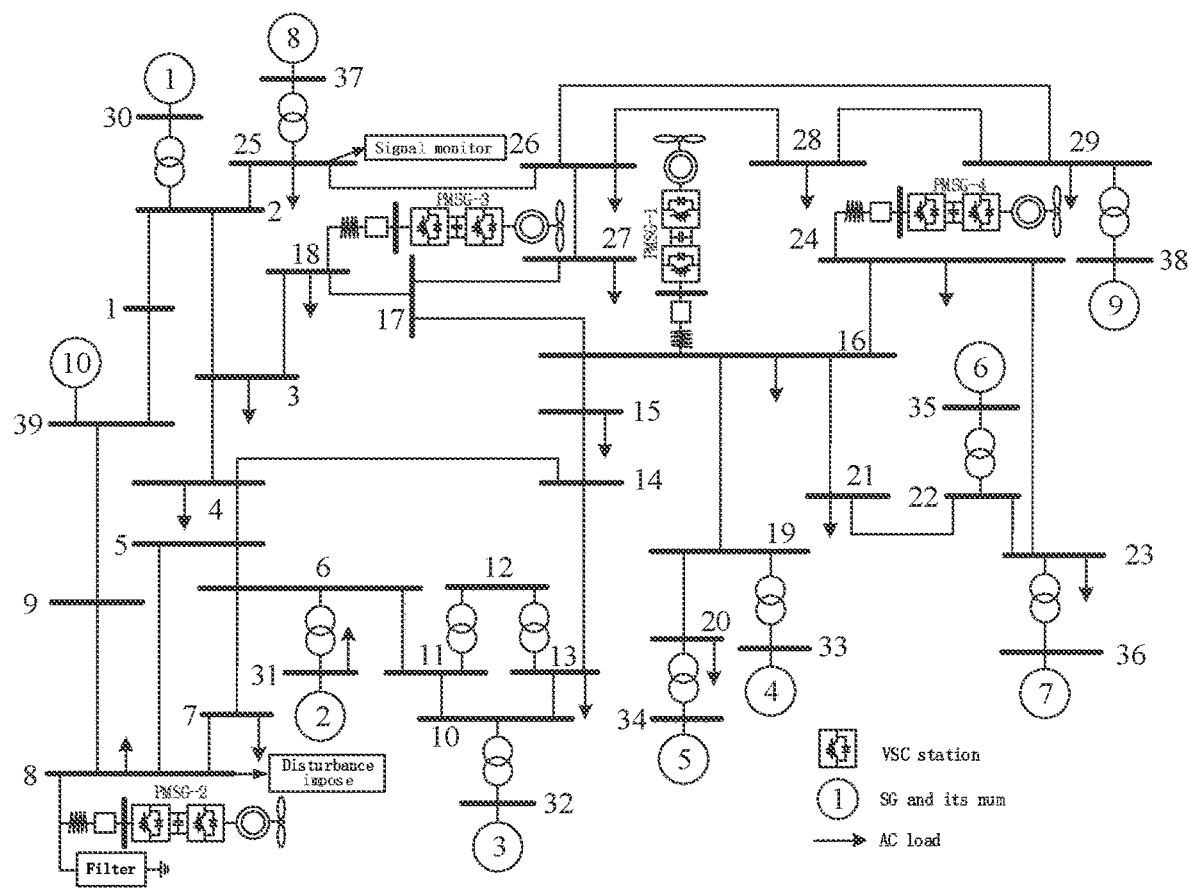
FIG. 51 illustrates points for injecting the disturbance signal and measuring signal.

The procedure to measure the residues for PMSG-2 is the same as that presented above in the step 5 for PMSG-1. The measurement data on the side of PMSG-2 and the noise reduced data are shown in FIG. 50(a) and FIG. 50(b). The residue of PMSG-2 is obtained to be 0.0003+0.0000j.

Figure 52A:
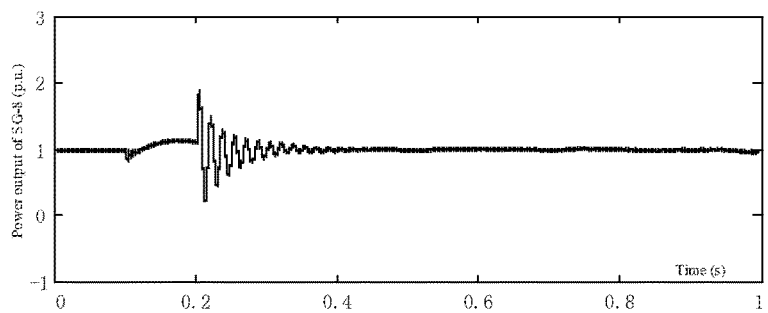
FIG. 52(a) illustrates active power output from SG-8 before filtering.
Figure 52B:
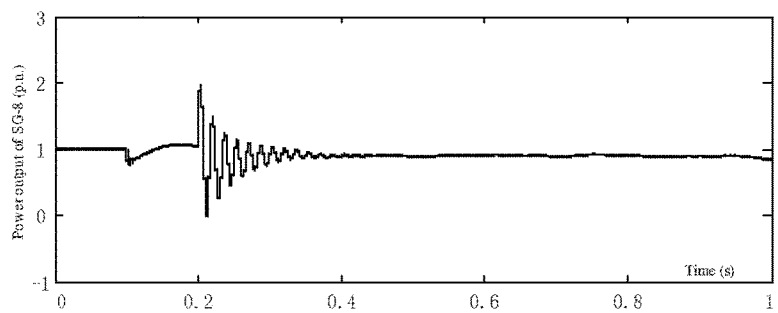
FIG. 52(b) illustrates active power output from SG-8 after filtering.
Figure 53:
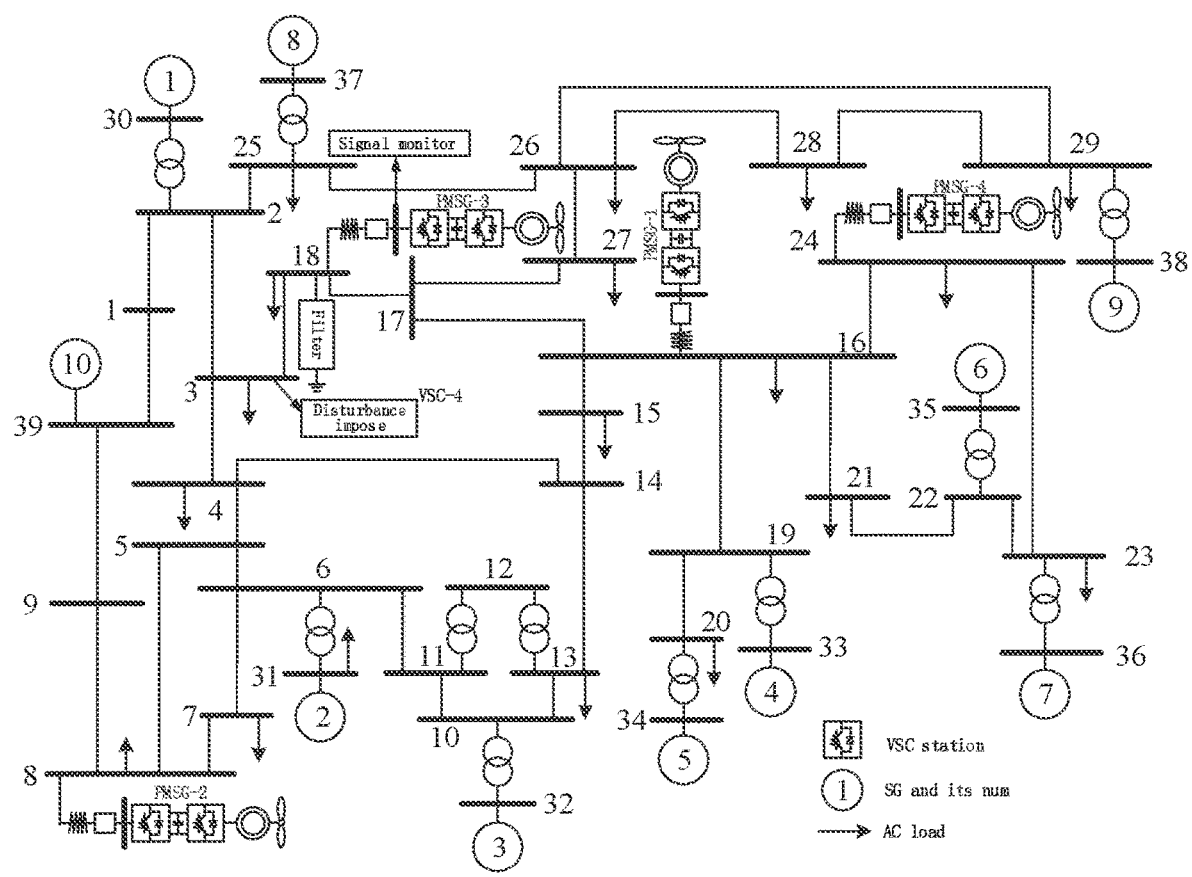
FIG. 53 illustrates installation location (3) of the high-pass filter.

The measurement data and noise reduced data on the side of power system are shown by FIG. 52(a) and FIG. 52(b) respectively. The residue of the ROPS subsystem is obtained to be −0.0000+0.0007j.

Step 7: installing a parallel band-pass filter on the side of PMSG-3 and measure the residues.

Figure 54A:
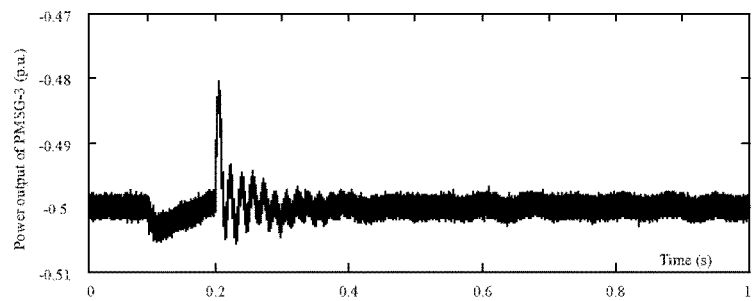
FIG. 54(a) illustrates active power output from PMSG-3 before filtering.
Figure 54B:
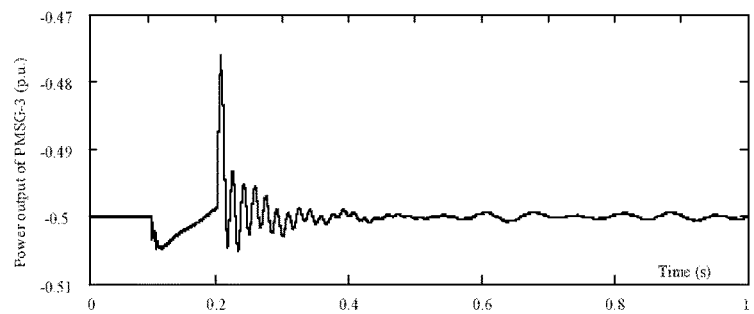
FIG. 54(b) illustrates active power output from PMSG-3 after filtering.
Figure 55:
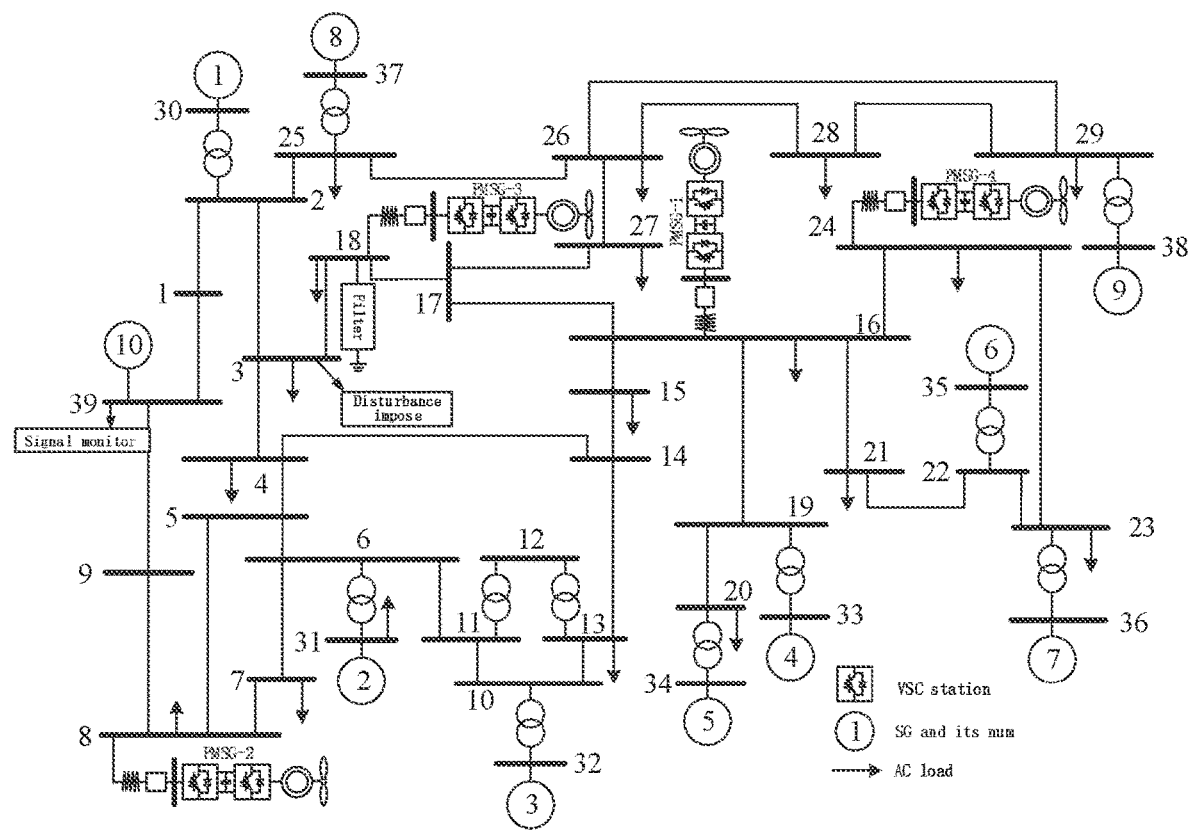
FIG. 55 illustrates points for injecting the disturbance signal and measuring signal.

The procedure to measure the residues for PMSG-3 is the same as that presented above in the step 5 for PMSG-1. The measurement data on the side of PMSG-3 and the noise reduced data are shown in FIG. 54(a) and FIG. 54(b). The residue of PMSG-3 is obtained to be 0.0001+0.0000j.

Figure 56A:
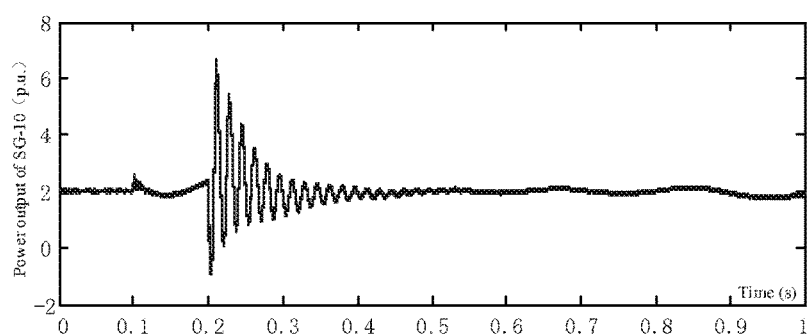
FIG. 56(a) illustrates active power output from SG-10 before filtering.
Figure 56B:
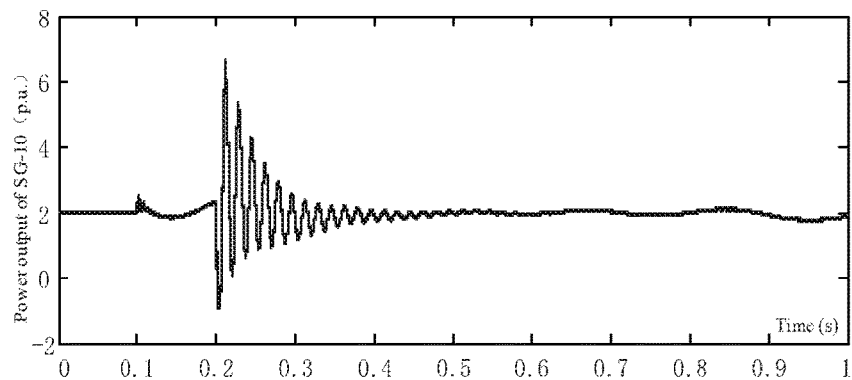
FIG. 56(b) illustrates active power output from SG-10 after filtering.
Figure 57:
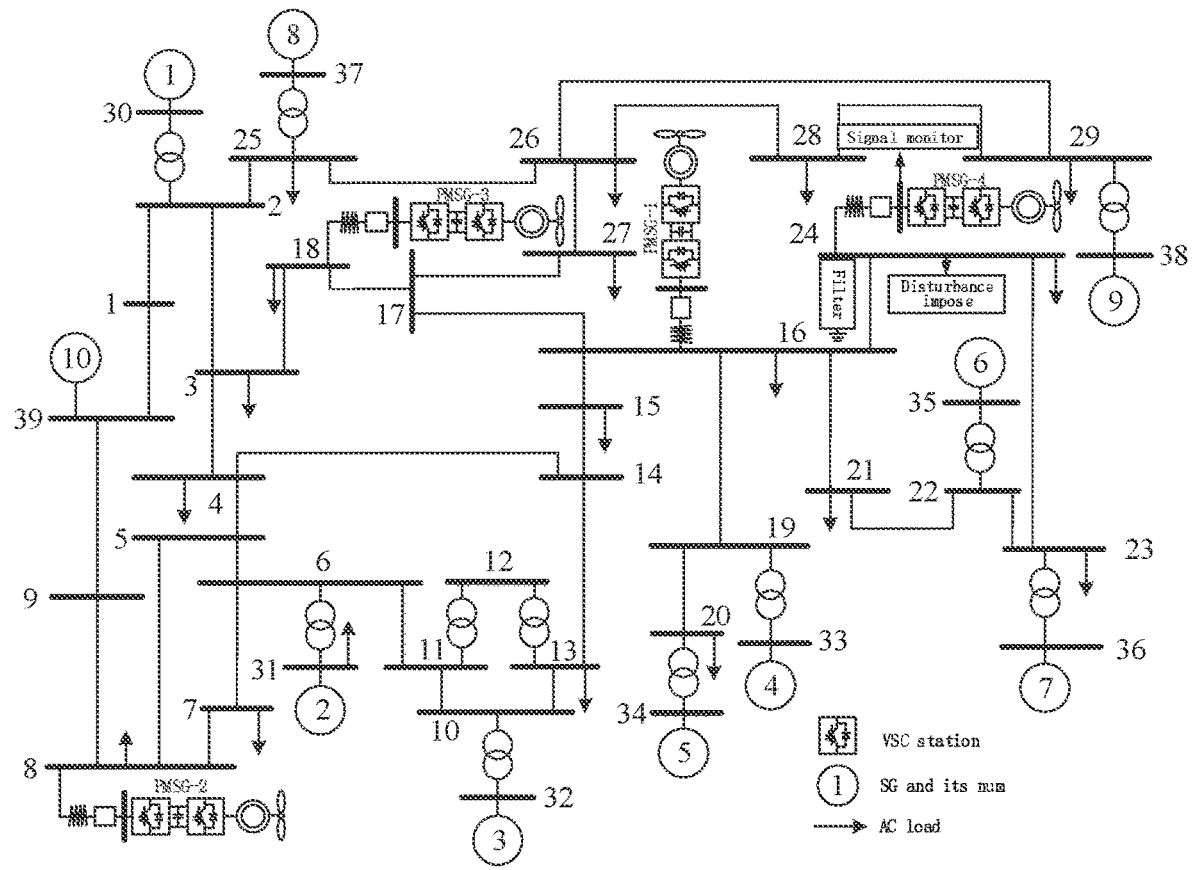
FIG. 57 illustrates installation location (4) of the high-pass filter.

The measurement data and noise reduced data on the side of power system are shown by FIG. 56(a) and FIG. 56(b) respectively. The residue of the ROPS subsystem is obtained to be −0.0000+0.0000j.

Step 8: installing a parallel band-pass filter on the side of PMSG-4 and measure the residues.

Figure 58A:
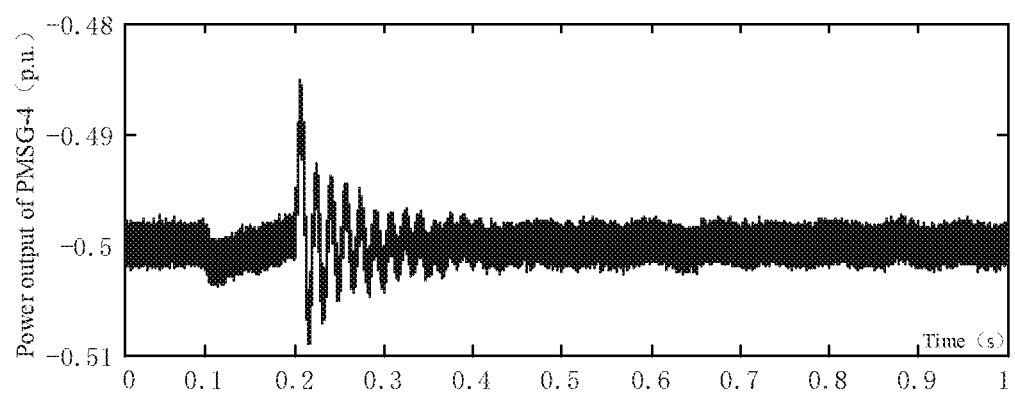
FIG. 58(a) illustrates active power output from PMSG-4 before filtering.
Figure 58B:
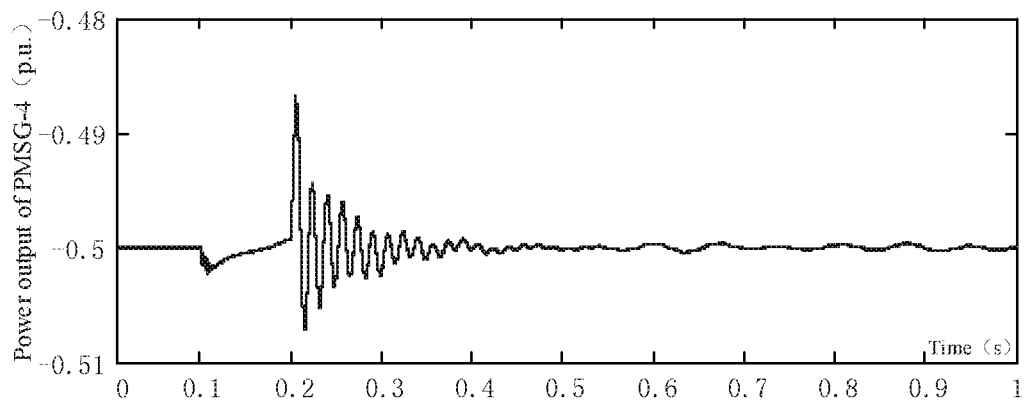
FIG. 58(b) illustrates active power output from PMSG-4 after filtering.
Figure 59:
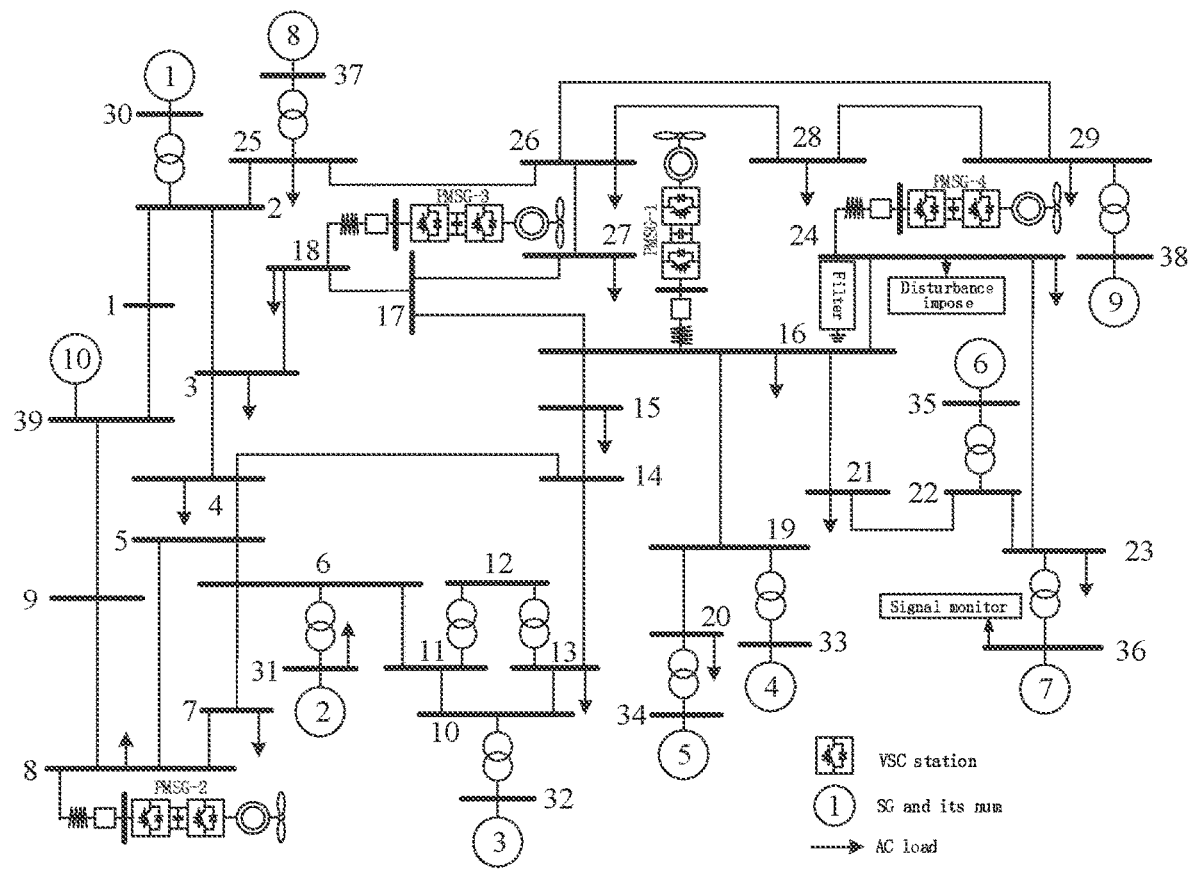
FIG. 59 illustrates points for injecting the disturbance signal and measuring signal.

The procedure to measure the residues for PMSG-4 is the same as that presented above in the step 5 for PMSG-1. The measurement data on the side of PMSG-4 and the noise reduced data are shown in FIG. 58(a) and FIG. 58(b). The residue of PMSG-4 is obtained to be 0.0006+0.0005j.

Figure 60A:
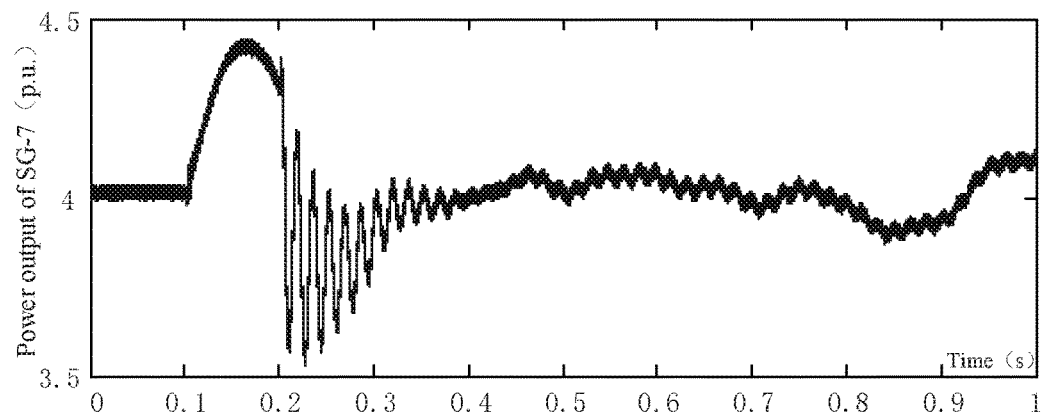
FIG. 60(a) illustrates active power output from SG-7 before filtering.
Figure 60B:
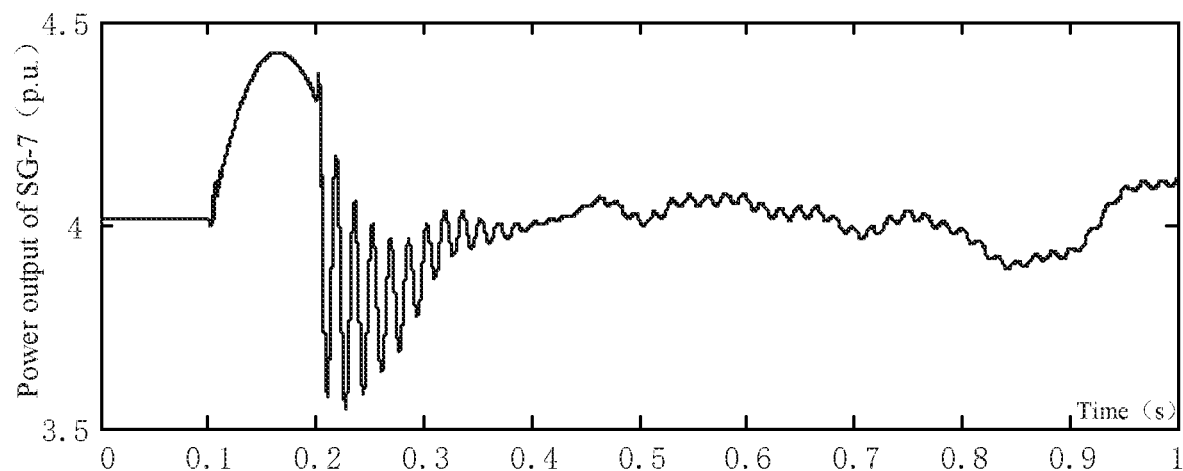
FIG. 60(b) illustrates active power output from SG-7 after filtering.

The measurement data and noise reduced data on the side of power system are shown by FIG. 60(a) and FIG. 60(b) respectively. The residue of the ROPS subsystem is obtained to be −0.0000+0.0007j.

4. Identify the Wind Turbine Generators which Cause the SSOs According to the Indexes Step 9: calculating the indexes.

The indexes $Z_i=|\sqrt{R_iR_{ai}}|$, i=1, 2, 3, 4 are computed based on the residues obtained above, where $R_i$ and $R_{ai}$, i=1, 2, 3, 4 are the residues of each wind turbine generator and the corresponding ROPS subsystem, respectively. The computational results are presented in Tab. 2-1.

TABLE 2-1

Results of residues and corresponding index obtained by using the present invention

| Index | Value | The cause of the SSOs |
| --- | --- | --- |
| Z1 (PMSG-1) | 0.0020 + 0.0130i | Yes |
| Z2 (PMSG-2) | 0.0003 + 0.0003i | No |
| Z3 (PMSG-3) | ≈0 | No |
| Z4 (PMSG-4) | ≈0 | No |

Step 10: identifying the wind turbine generator which causes the SSOs.

According to the open-loop modal resonance theory, the wind turbine generator corresponding to the maximum index among all Zi is identified to be the wind turbine generator causing the SSOs. Therefore, PMSG-1 is identified to be the cause of the SSOs in the 10-machine 39-node power system.

5. Verify the Correctness of Result Made by the Present Invention

The linearized model of FIG. 40 is used in this section to verify the correctness of the above identification made by the present invention.

Step 11: establishing the parametric model of the power system integrated with wind turbine generators.

The open-loop linearized models of each wind turbine generator subsystem and the corresponding ROPS subsystem described by Eq. (1) and Eq. (2) are respectively derived. Following notations are used to denote various results of derived parametric models and computational results $A_{pmi}$, $b_{pmi}$, $c_{pmi}$, i=1, 2, 3, 4 are the state matrix, control vector and output vector of open-loop state-space models of PMSG-1, PMSG-2, PMSG-3, and PMSG-4, respectively;

$p_{pmi}$, $r_{pmi}$, i=1, 2, 3, 4 are the left and right eigenvectors corresponding to the open-loop SSO modes of PMSG-1, PMSG-2, PMSG-3, and PMSG-4.

$A_{pmaci}$, $b_{pmaci}$, $c_{pmaci}$, i=1, 2, 3, 4 are the state matrix, control vector and output vector of open-loop state-space models of the ROPS subsystem without PMSG-1, PMSG-2, PMSG-3, and PMSG-4 being included, respectively;

$p_{pmaci}$, $r_{pmaci}$, i=1, 2, 3, 4 are the left and right eigenvectors corresponding to the open-loop SSO modes of ROPS subsystem without PMSG-1, PMSG-2, PMSG-3, and PMSG-4 being included, respectively;

Step 12: calculating the residues of each open-loop wind turbine generator subsystem and corresponding open-loop ROPS subsystems.

From the results obtained in the step 11, the open-loop residues of PMSG-1 and the corresponding ROPS subsystem are calculated to be $R_{pm1}=p_{pm1}^T b_{pm1} c_{pm1} r_{pm1}=-3.02+134.24i$ and $R_{pmac1}=p_{pmac1}^T b_{pmac1} c_{pmac1} r_{pmac1}=-0.01+j0.002$, respectively. Thus, the index associated with PMSG-1 is calculated to be $Z_{r1}=\sqrt{R_{pm1}R_{pmac1}}=0.63+0.64i$ Similarly, the open-loop residues of PMSG-2 and the corresponding ROPS subsystem are calculated to be $R_{pm2}=p_{pm2}^T b_{pm2} c_{pm2} r_{pm2}=0$ and $R_{pmac2}=p_{pmac2}^T b_{pmac2} c_{pmac2} r_{pmac2}=-0.006+j0.004$, respectively. The index associated with PMSG-2 is calculated to be $Z_{r2}=\sqrt{R_{pm2}R_{pmac2}}=0$.

The open-loop residues of PMSG-3 and the corresponding ROPS subsystem are calculated to be $R_{pm3}=p_{pm3}^T b_{pm3} c_{pm3} r_{pm3}=0$ and $R_{pmac3}=p_{pmac3}^T b_{pmac3} c_{pmac3} r_{pmac3}=-0.011+j0.001$, respectively. The index associated with PMSG-3 is calculated to be $Z_{r3}=\sqrt{R_{pm3}R_{pmac3}}=0$.

The open-loop residues of PMSG-4 and the corresponding ROPS subsystem are calculated to be $R_{pm4}=p_{pm4}^T b_{pm4} c_{pm4} r_{pm4}=0$ and $R_{pmac4}=p_{pmac4}^T b_{pmac4} c_{pmac4} r_{pmac4}=-0.008+j0.002$, respectively. The index associated with PMSG-4 is calculated to be $Z_{r4}=\sqrt{R_{pm4}R_{pmac4}}=0$.

Step 13: verifying the correctness of result obtained in the step 10 by the present invention.

Computational results of indexes above by using the parametric model are listed in Table 2-2. It can be seen that PMSG-1 causes the SSOs, confirming the correctness of identification made previously from Table 2-1 by using the present invention.

TABLE 2-2

Results of residues and index obtained using the parametric model for confirmation

| Index | Method in the present invention | The cause of the SSOs | Parametric model method | The cause of the SSOs |
| --- | --- | --- | --- | --- |
| Z1 (PMSG-1) | $Z_{b1}$ = 1 | Yes | $Z_{br1}$ = 1 | Yes |
| Z2 (PMSG-2) | $Z_{b2}$ = 0.0321 | No | $Z_{br2}$ = 0.0000 | No |
| Z3 (PMSG-3) | $Z_{b3}$ = 0.0000 | No | $Z_{br3}$ = 0.0000 | No |
| Z4 (PMSG-4) | $Z_{b4}$ = 0.0000 | No | $Z_{br4}$ = 0.0000 | No |

Figure 61:
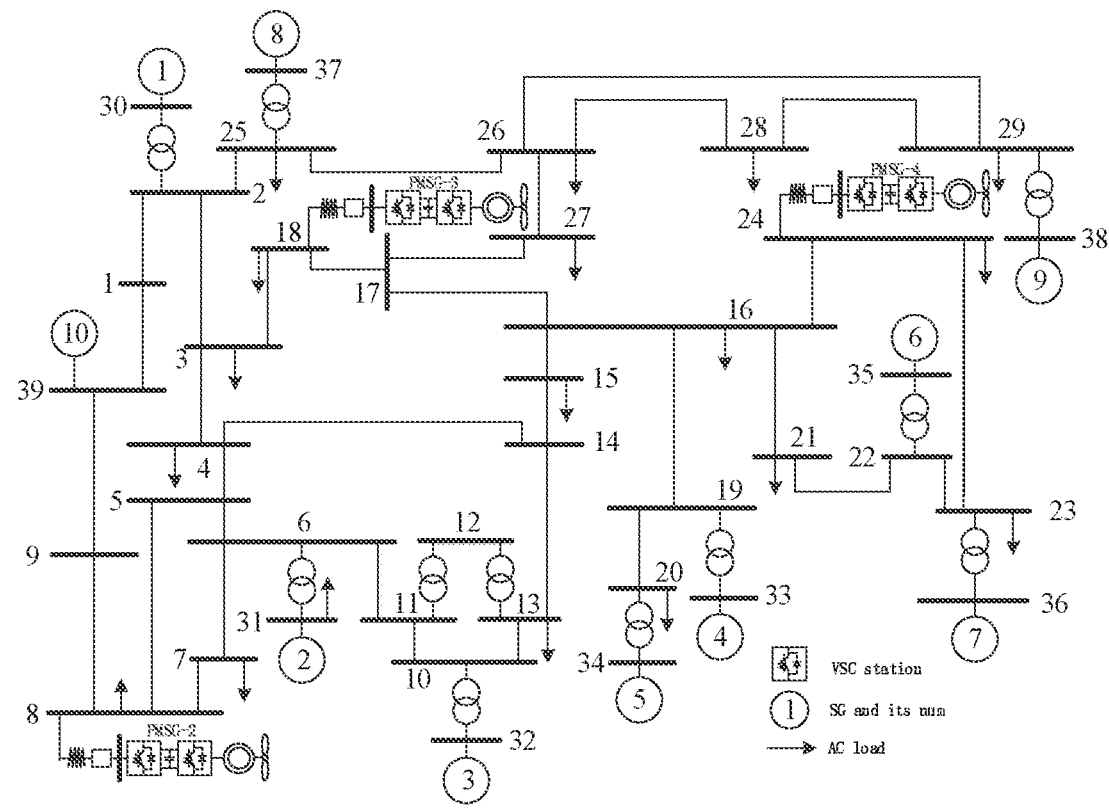
FIG. 61 illustrates configuration of the power system without PMSG-1.
Figure 62:
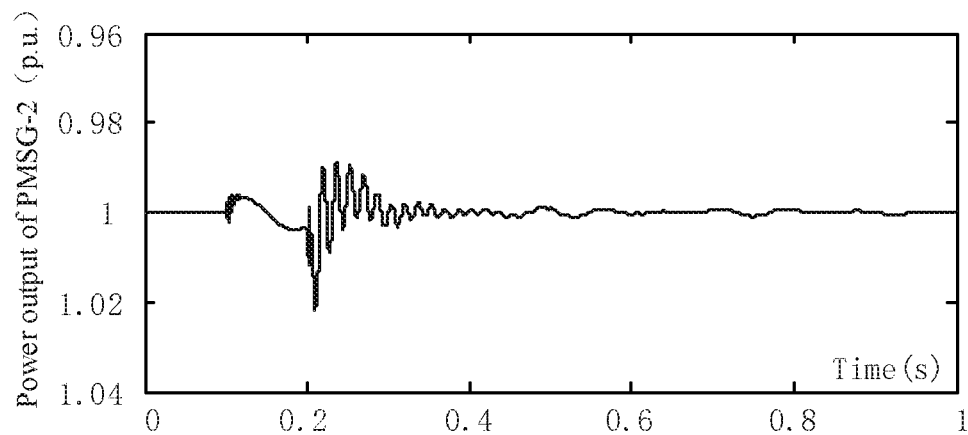
FIG. 62(a) illustrates active power output from PMSG-2 without PMSG-1.
FIG. 62(b) illustrates active power output from PMSG-3 without PMSG-1.
FIG. 62(c) illustrates active power output from PMSG-4 without PMSG-1.
Figure 62:
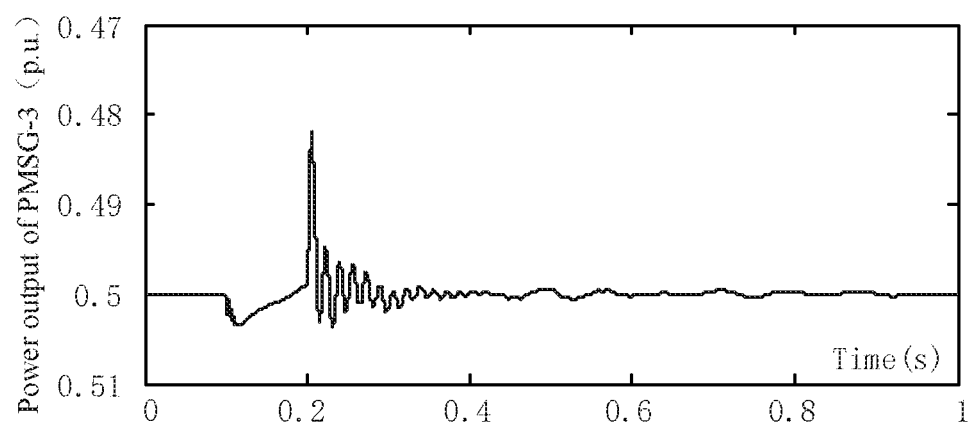
Figure 62:
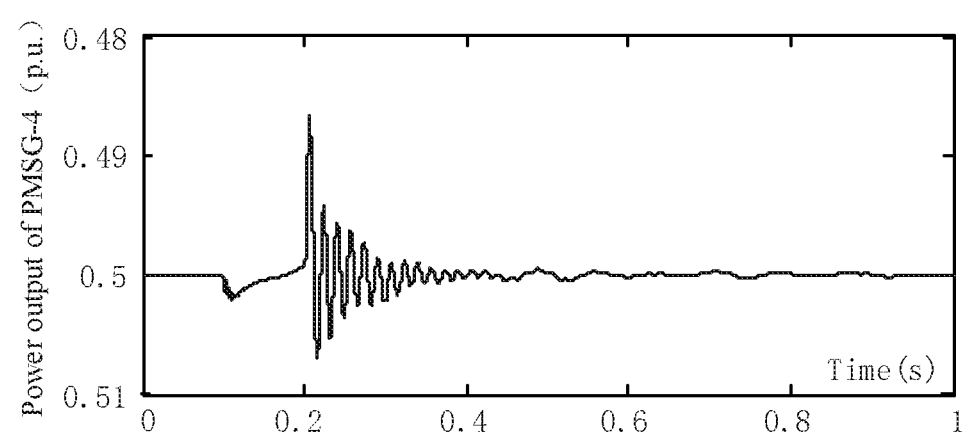

PMSG-1 is disconnected from the example power system as shown by FIG. 61. Simulation results are shown from FIG. 62(*a*) to FIG. 62(*c*). It can be seen that no SSOs occur in the example power system, confirming that PMSG-1 causes the SSOs as identified by the present invention.

What is claimed is:

1. A measurement data based method for identifying wind turbine generators which cause sub-synchronous oscillations (SSOs) in a complex power system, comprising following steps of:
   (1) obtaining a set of measurement data when the SSOs occur in the power system; reducing noise by applying a filtering algorithm; identifying an SSO frequency by using a signal processing method; wherein the identified SSO frequency is denoted as $f_s$;
   (2) designing a parallel band-pass filter to ensure that only a signal at frequency $f_s$ passes through to earth and signals at other frequencies are suppressed;
   (3) for a power system with n wind turbine generators, installing the parallel band-pass filter designed in the step (2) on an interface between each of the wind turbine generators and the power system; wherein subsequently, dynamic interactions between the wind turbine generators and the power system at the SSO frequency $f_s$ are suppressed and filtered out; whilst those at other frequencies are not affected;
   (4) measuring a response from each of the wind turbine generators by adding a disturbance signal on a side of a wind turbine generator near the band-pass filter;
   (5) from the measurement data of the response of an i-th wind turbine generator, identifying an oscillation frequency, $f_{ij}$, and residuing $R_{ij}$ by applying a signal processing method; wherein in notations above for $f_{ij}$ and $R_{ij}$, subscript i refers to the i-th wind turbine generator and the subscript j refers to the j-th SSO frequency identified;
   afterwards, comparing $f_{ij}$ and $f_s$; recording the $f_{ij}$ and $R_{ij}$ if a following condition is met:

$1.05*f_s \geq f_{ij} \geq 0.95*f_s$;

wherein finally, if no $f_{ij}$ which can meet the above condition, it is concluded that the i-th wind turbine generator is not the wind turbine generator which causes the SSOs in the power system;
   (6) measuring the response from the power system by adding a disturbance signal on the side of the power system near the band-pass filter for the i-th wind turbine generator;
   (7) from the measurement data of the response, identifying an oscillation frequency $f_{aij}$ and a residue $R_{aij}$ by using the signal processing method; wherein in notations of $f_{aij}$ and $R_{aij}$, subscript a indicates that the measurement data is about the power system, subscript i refers to the i-th wind turbine generator and subscript j refers to the j-th oscillation frequency and residue;
   afterwards, comparing $f_{aij}$ and $f_s$; recording $f_{aij}$ and $R_{aij}$ if a following condition is met:

$1.05*f_s \geq f_{aij} \geq 0.95*f_s$ and (8) Computing $Z_i = |\sqrt{R_{ij}R_{aij}}|$, i=1, 2, L n based on recorded results in the step (5) and (7); wherein if $Z_k$ is the largest among $Z_i$, i=1, 2, L n, the i-th wind turbine generator is identified to be the wind turbine generator causing the SSOs in the power system.

2. The measurement data based method for identifying the wind turbine generators which cause the sub-synchronous oscillations in the complex power system, as described in claim 1, wherein the interface in the step (3) adopts any point between the i-th wind turbine generator and the power system; at the point, the power system is divided to two subsystems; one subsystem consists of the i-th wind turbine generator; the other subsystem is comprised of remainder of the power system excluding the i-th wind turbine generator.

3. The measurement data based method for identifying the wind turbine generators which cause the sub-synchronous oscillations in the complex power system, as described in claim 1, wherein the disturbance signal in the step (4) excites an observable dynamic response of the i-th wind turbine generator.

4. The measurement data based method for identifying the wind turbine generators which cause the sub-synchronous oscillations in the complex power system, as described in claim 1, wherein the response of the wind turbine generator in the step (4) is an active power output from the wind turbine generator.

5. The measurement data based method for identifying the wind turbine generators which cause the sub-synchronous oscillations in the complex power system, as described in claim 1, wherein the disturbance signal in the step (4) excites an observable dynamic response of the power system.

6. The measurement data based method for identifying the wind turbine generators which cause the sub-synchronous oscillations in the complex power system, as described in claim 1, wherein the power system response in the step (6) is a magnitude of a terminal voltage at a node in the power system where the i-th wind turbine generator is connected to the power system.

7. The measurement data based method for identifying the wind turbine generators which cause the sub-synchronous oscillations in the complex power system, as described in claim 1, wherein the disturbance signal in the step (4) or step (6) is an impulse signal; a time duration and a magnitude of the signal are respectively 0.1 second and 2% of a magnitude of a terminal voltage at a node where the i-th wind turbine generator is connected with the power system.

8. The measurement data based method for identifying the wind turbine generators which cause the sub-synchronous oscillations in the complex power system, as described in claim 2, wherein the disturbance signal in the step (4) or step (6) is an impulse signal; a time duration and a magnitude of the signal are respectively 0.1 second and 2% of a magnitude of a terminal voltage at a node where the i-th wind turbine generator is connected with the power system.

9. The measurement data based method for identifying the wind turbine generators which cause the sub-synchronous oscillations in the complex power system, as described in claim 3, wherein the disturbance signal in the step (4) or step (6) is an impulse signal, a time duration and a magnitude of the signal are respectively 0.1 second and 2% of a magnitude of a terminal voltage at a node where the i-th wind turbine generator is connected with the power system.

10. The measurement data based method for identifying the wind turbine generators which cause the sub-synchronous oscillations in the complex power system, as described in claim 4, wherein the disturbance signal in the step (4) or step (6) is an impulse signal; a time duration and a magnitude of the signal are respectively 0.1 second and 2% of a magnitude of a terminal voltage at a node where the i-th wind turbine generator is connected with the power system.

11. The measurement data based method for identifying the wind turbine generators which cause the sub-synchronous oscillations in the complex power system, as described in claim 5, wherein the disturbance signal in the step (4) or step (6) is an impulse signal; a time duration and a magnitude of the signal are respectively 0.1 second and 2% of a magnitude of a terminal voltage at a node where the i-th wind turbine generator is connected with the power system.

12. The measurement data based method for identifying the wind turbine generators which cause the sub-synchronous oscillations in the complex power system, as described in claim 6, wherein the disturbance signal in the step (4) or step (6) is an impulse signal, a time duration and a magnitude of the signal are respectively 0.1 second and 2% of the magnitude of the terminal voltage at the node where the i-th wind turbine generator is connected with the power system.

\* \* \* \* \*